(12) United States Patent
Irwin et al.

(10) Patent No.: US 9,466,798 B2
(45) Date of Patent: Oct. 11, 2016

(54) TUNABLE PHOTOACTIVE COMPOUNDS

(71) Applicants: Michael D. Irwin, El Paso, TX (US); Jerred A. Chute, El Paso, TX (US); Robert D. Maher, III, Plano, TX (US)

(72) Inventors: Michael D. Irwin, El Paso, TX (US); Jerred A. Chute, El Paso, TX (US); Robert D. Maher, III, Plano, TX (US)

(73) Assignee: Hunt Energy Enterprises, L.L.C., Dallas, TX (US)

( * ) Notice: Subject to any disclaimer, the term of this patent is extended or adjusted under 35 U.S.C. 154(b) by 0 days.

(21) Appl. No.: 13/869,325

(22) Filed: Apr. 24, 2013

(65) Prior Publication Data

US 2014/0275602 A1   Sep. 18, 2014

Related U.S. Application Data

(63) Continuation of application No. 13/839,349, filed on Mar. 15, 2013.

(51) Int. Cl.
*H01L 51/00* (2006.01)
*H01G 9/20* (2006.01)

(52) U.S. Cl.
CPC ........ *H01L 51/0058* (2013.01); *H01L 51/006* (2013.01); *H01G 9/2031* (2013.01); *H01G 9/2059* (2013.01); *H01L 51/0061* (2013.01); *H01L 51/0071* (2013.01); *H01L 51/0074* (2013.01); *Y02E 10/542* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 4,883,561 | A | 11/1989 | Gmitter et al. |
| 5,482,570 | A | 1/1996 | Saurer et al. |
| 7,118,936 | B2 | 10/2006 | Kobayashi et al. |
| 2009/0044855 | A1 | 2/2009 | Irwin et al. |
| 2010/0218825 | A1 | 9/2010 | Jee et al. |
| 2010/0282320 | A1 | 11/2010 | Meyers et al. |
| 2011/0005589 | A1 | 1/2011 | Chianelli et al. |
| 2012/0032166 | A1 | 2/2012 | Kawakita |
| 2013/0220421 | A1 | 8/2013 | Irwin et al. |

FOREIGN PATENT DOCUMENTS

| | | |
|---|---|---|
| KR | 10-1172374 B1 | 8/2012 |
| WO | 2008-118422 A1 | 10/2008 |
| WO | 2011/137508 A1 | 11/2011 |
| WO | 2013/028525 A1 | 2/2013 |

OTHER PUBLICATIONS

Durant et al. Chem. Rev. 2010, 6736-6767.*
Pron et al. Journal of Physical Chemistry, 2011, 15006-15017.*
http://pubs.acs.org/journal/joceah; webpage retrieved Feb. 23, 2015.*
http://www.sciencedirect.com/science/journal/00404039; webpage retreived Feb. 23, 2015.*

"The Chemistry of Fluorene and Its Derivatives" by George Rieveschl, Jr. et al., Department of Chemistry, University of Cincinnati, Ohio, pp. 287-389, Jul. 16, 1937.
"Simple Triarylamine-Based Dyes Containing Fluorene and Biphenyl Linkers for Efficient Dye-Sensitized Solar Cells" by Abhishek Baheti et al., The Journal of Physical Chemistry, Mar. 12, 2009, 113, pp. 8541-8547.
"Dipolar Compounds Containing Fluorene and a Heteroaromatic Ring as the Conjugating Bridge for High-Performance Dye-Sensitized Solar Cells" by Chih-Hsin Chen et al., Chem. Eur. J. 2010, 16, pp. 3184-3193.
"Pyrrole-Based Organic Dyes for Dye-Sensitized Solar Cells" by Yung-Sheng Yen et al., J. Phys. Chem. C 2008, 112, pp. 12557-12567, Feb. 4, 2008.
Graetzel; "Conversion of sunlight to electric power by nanocrystalline dye-sensitized solar cells"; Journal of Photochemistry and Photobiology A: Chemistry (164); pp. 3-14, 2004.
Zhang et al.; "Slow interfacial charge recombination in solid-state dye-sensitized solar cell using Al2O3-coated nanoporous TiO2 films"; Solar Energy Materials & Solar Cells (81); pp. 197-203, 2004.
Chung et al.; "All-solid-state dye-sensitized solar cells with high efficiency"; Nature, vol. 485; pp. 486-489; 2012.
Lin et al., "Benzothiadiazole-Containing Donor-Acceptor-Acceptor Type Organic Sensitizers for Solar Cells with ZnO Photoanodes" Chem. Commun., 2012, 48, 12071-12073 and Electronic Supplementary Information http://www.rsc.org/suppdata/cc/c2/c2cc37184g.pdf.
Office Action issued in related U.S. Appl. No. 13/869,426 mailed Feb. 27, 2014, 20 pages.
Lee et al., "Enhancing the performance of dye-sensitized solar cells based on an organic dye by incorporating TiO2 nanotube in a TiO2 nanoparticle film", Electrochimica Acta 54 (2009) pp. 4123-4130.
Office Action issued in related U.S. Appl. No. 13/839,349 mailed Jan. 30, 2014, 19 pages.
International Search Report and Written Opinion issued in related PCT Application No. PCT/US21014/025910 mailed on Jun. 20, 2014, 15 pages.

* cited by examiner

*Primary Examiner* — Clinton Brooks
(74) *Attorney, Agent, or Firm* — Baker Botts L.L.P.

(57) ABSTRACT

Photoactive compositions of matter, methods for their design and synthesis, and various applications of such compositions of matter are disclosed. Such photoactive compositions may, for example, include any one or more of the following: a core moiety; a primary electron donor moiety; an electron-withdrawing moiety; and an alkyl tail. Some photoactive compositions may further include multiple additional electron donor moieties, electron-withdrawing moieties, and alkyl tails. Methods for designing such photoactive compositions may include selecting a core moiety; selecting an electron-withdrawing moiety to add to the core moiety in order to modify the composition's electronic properties; selecting a primary electron donor moiety to be added in order to further modify the composition's electronic properties; selecting a second electron donor moiety to be added in order to modify the composition's electronic properties even further, if necessary; and synthesizing the designed composition.

7 Claims, 21 Drawing Sheets

(Z)-2-cyano-3-[9,9-diethyl-7-(N-phenylanilino)
fluoren-2-yl]prop-2-enoic acid T1

2-[[9,9-diethyl-7-(N-phenylanilino)fluoren-2-yl]
methylene]propanedinitrile (E)-2-cyano-3-[9,9-diethyl-7-[N-(2-naphthyl) anilino]fluoren-2-yl]prop-2-enoic acid (E)-2-cyano-3-[9,9-diethyl-7-[N-(1-naphthyl)anilino]fluoren-2-yl]prop-2-enoic acid

TUNABLE PHOTOACTIVE COMPOUNDS

RELATED APPLICATIONS

This application is a continuation of U.S. application Ser. No. 13/839,349, entitled "Tunable Photoactive Compounds," which was filed on Mar. 15, 2013, the entire disclosure of which is incorporated herein by reference.

BACKGROUND

Use of photovoltaics (PVs) to generate electrical power from solar energy or radiation may provides many benefits, including, for example, a power source, low or zero emissions, power production independent of the power grid, durable physical structures (no moving parts), stable and reliable systems, modular construction, relatively quick installation, safe manufacture and use, and good public opinion and acceptance of use.

SUMMARY

An emerging sector of photovoltaic ("PV") technologies is based on organic materials which act as light absorbers and semiconductors in lieu of legacy materials like silicon. Organic electronics promise flexible, robust devices that can be fabricated cheaply by methods such as roll-to-roll printing. This has been demonstrated to date industrially with organic light-emitting diodes common today in mobile devices. Recent strides in Organic PV ("OPV") technologies have reached performance levels approaching that of their inorganic, legacy counterparts; however, the cost of the specialty chemicals utilized as light-absorbers and semiconductors, such as Ruthenium-based dyes, has been prohibitive in bringing OPVs to market.

The present disclosure relates generally to relatively low-cost photoactive compositions of matter, as well as apparatuses and methods for use of the photoactive compositions of matter in OPV cells to convert solar radiation to electrical energy. These compositions of matter may be deployed in a variety of OPV devices, such as heterojunction cells (e.g., bilayer and bulk), hybrid cells (e.g., organics with ZnO nanorods or PbS quantum dots), and DSSCs (dye-sensitized solar cells). The latter, DSSCs, exist in three forms: solvent-based electrolytes, ionic liquid electrolytes, and solid-state hole transporters. These compositions may also advantageously be used in any organic electronic device, including but not limited to batteries, field-effect transistors (FETs), and light-emitting diodes (LEDs). The present disclosure further provides methods for designing such compositions of matter, in some embodiments allowing tunability of the compositions to obtain desirable characteristics in different applications.

The flexibility of the design and tunability of the photoactive compositions of the present disclosure may allow for a wide variety of potential sources of synthetic material consistent with the present disclosure. In some embodiments, the petroleum by-product "asphaltenes" provides a desirable source of materials for design and synthesis of the photoactive compounds of the present disclosure. Asphaltenes are rich in aromatic complexes, yet cheap and abundant, making them in some cases an ideal source for such photoactive materials. Of the myriad of chemical compounds contained within asphaltenes, several are of particular interest in the synthesis of light-absorbing molecules for use in OPV and other organoelectric devices including heterojunction, hybrid, and DSSC OPVs, as well as batteries, FETs and LEDs. Thus, in some embodiments, the compositions of the present disclosure may be derived from asphaltene materials such as fluorenes, naphthalenes, benzothiophenes, dibenzothiophenes, naphthothiophenes, dinaphthothiophenes, benzonaphthothiophenes, benzenes, benzothiazoles, benzothiadiazoles, cyclopentabisthiophenes, and thienothiophenes.

In some embodiments, the present disclosure provides a method for designing a tunable photoactive compound. This method may in some embodiments include selecting a core moiety; selecting an application for the compound; selecting an electron-withdrawing moiety; calculating electronic properties of the compound; synthesizing the compound; testing the compound; and optimizing the compound. In some embodiments, the method may further include selecting a primary electron donor moiety and calculating electronic properties of the compound. In some embodiments, the method may further include selecting a second electron donor moiety and calculating electronic properties of the compound. In some embodiments, the method may further include selecting a second electron-withdrawing moiety and calculating electronic properties of the compound. In some embodiments, any or all of the selections may be made based at least in part upon a corresponding electronic property calculation or calculations. In some embodiments, any or all selections may be iteratively repeated based at least in part upon a corresponding electronic property calculation or calculations.

In some embodiments, the present disclosure provides a chemical compound including: a primary electron donor moiety; a core moiety; a second electron donor moiety; an electron-withdrawing moiety; and an alkyl tail; wherein the primary electron donor moiety is covalently bonded to the core moiety, the core moiety is covalently bonded to the second electron donor moiety, and the second electron donor moiety is covalently bonded to the electron-withdrawing moiety. In some embodiments, the present disclosure provides a chemical compound having the structural formula:

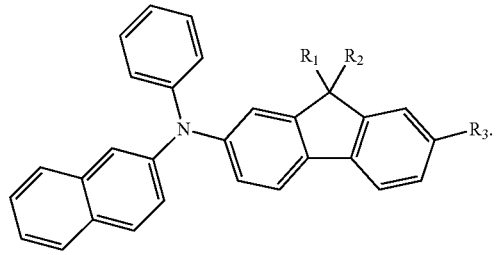

In other embodiments, the present disclosure provides a chemical compound having the structural formula:

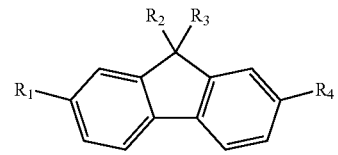

wherein $R_1$ includes a primary electron donor moiety including at least one substituent selected from the group consisting of: aryl amine; aryl phosphine; aryl arsine; aryl stibine; aryl sulfide; aryl selenide; phenyl; phenol; alkoxy phenyl; dialkoxy phenyl; and alkyl phenyl; and wherein $R_2$ includes a first alkyl tail including three or more carbon atoms; and wherein $R_3$ includes a second alkyl tail including three or more carbon atoms.

In some embodiments, the present disclosure provides a photovoltaic cell including a first electrode, an active layer including a photoactive organic compound, and a second electrode; wherein the active layer is between the first and second electrodes; and wherein the photoactive organic compound includes a primary electron donor moiety, a core moiety, a second electron donor moiety, an electron-withdrawing moiety, and an alkyl tail. In some embodiments, the primary electron donor moiety is covalently bonded to the core moiety, the core moiety is covalently bonded to the second electron donor moiety, and the second electron donor moiety is covalently bonded to the electron-withdrawing moiety.

In other embodiments, the present disclosure provides a photovoltaic cell including a first electrode, an active layer including a photoactive organic compound, and a second electrode; wherein the active layer is between the first and second electrodes; and wherein the photoactive organic compound includes a chemical compound having the structural formula:

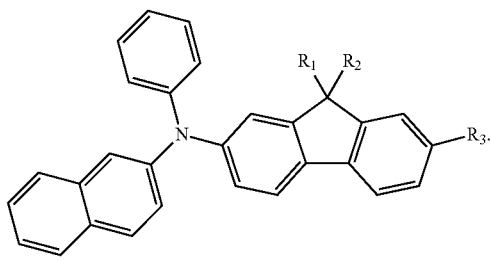

In other embodiments, the present disclosure provides a photovoltaic cell including a first electrode, an active layer including a photoactive organic compound, and a second electrode; wherein the active layer is between the first and second electrodes; and wherein the photoactive organic compound includes a chemical compound having the structural formula:

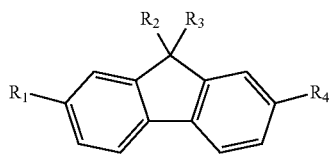

wherein $R_1$ includes a primary electron donor moiety including at least one substituent selected from the group consisting of: aryl amine; aryl phosphine; aryl arsine; aryl stibine; aryl sulfide; aryl selenide; phenyl; phenol; alkoxy phenyl; dialkoxy phenyl; and alkyl phenyl; and wherein $R_2$ includes a first alkyl tail including three or more carbon atoms; and wherein $R_3$ includes a second alkyl tail including three or more carbon atoms.

The features and advantages of the present disclosure will be readily apparent to those skilled in the art. While numerous changes may be made by those skilled in the art, such changes are within the spirit of the invention.

Figure 20:
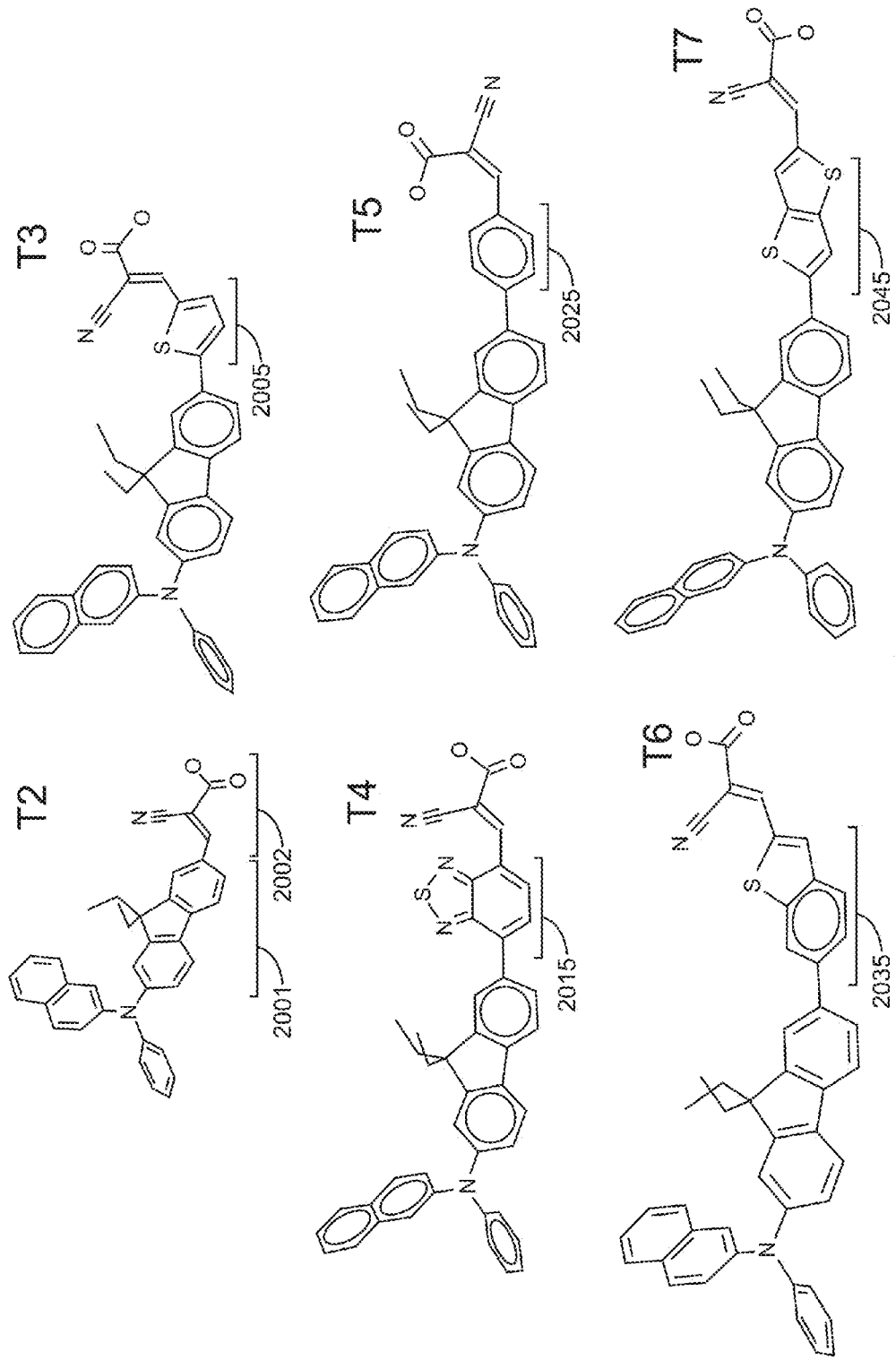

FIG. 20 illustrates chemical structures for various embodiments of the present disclosure, labeled T2, T3, T4, T5, T6, and T7.

Figure 21:
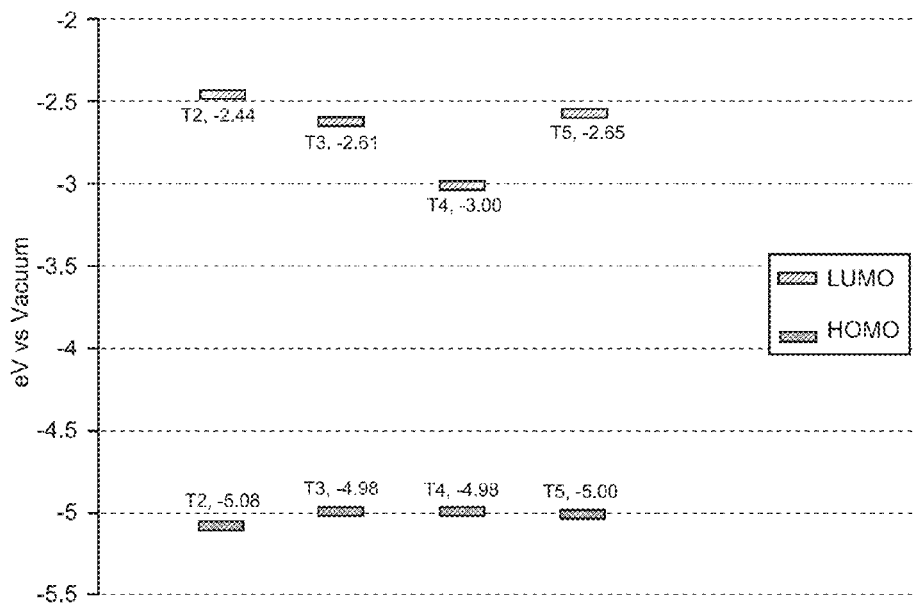

FIG. 21 is a graph containing data derived from computations carried out by molecular modeling software, and which shows HOMO and LUMO values of T2, T3, T4, and T5 of FIG. 20.

Figure 22:
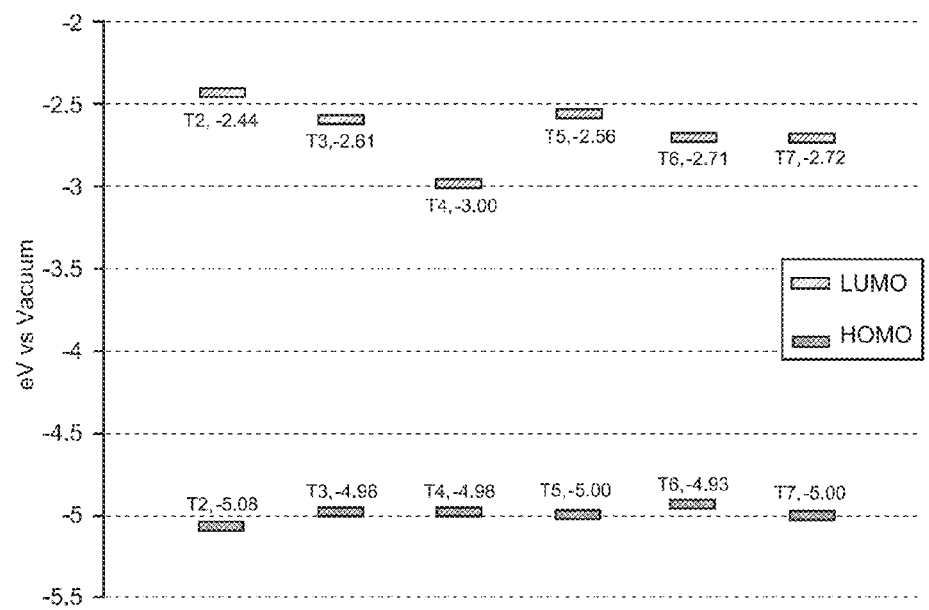

FIG. 22 is a graph containing data derived from computations carried out by molecular modeling software, and which shows HOMO and LUMO values of T6 and T7 of FIG. 20.

Figure 23:
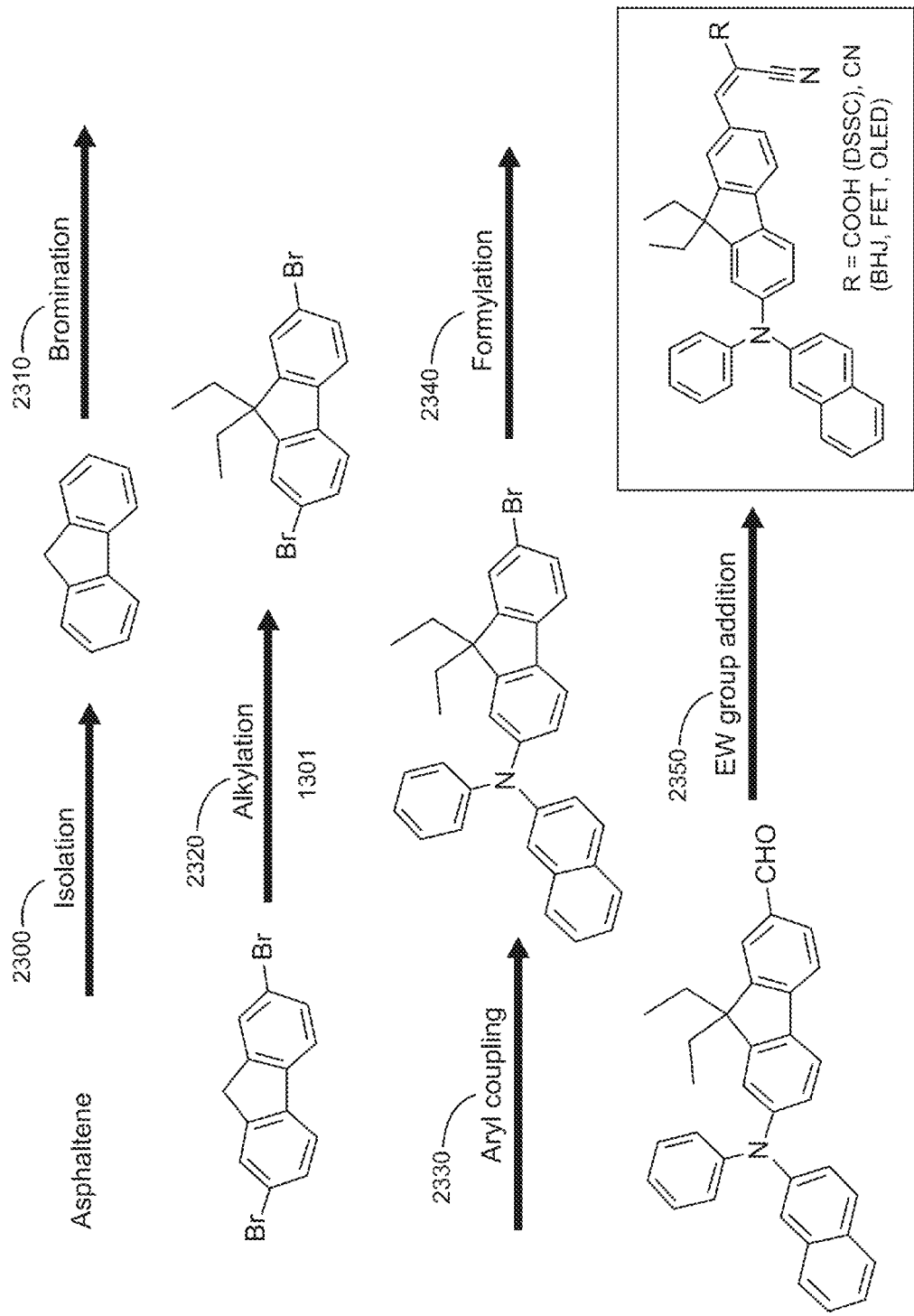

FIG. 23 is an example synthetic pathway for the formation of (Z)-2-cyano-3-[9,9'-diethyl-6-[N-(2-naphthyl)aniline] fluoren-3-yl]prop-2-enoic acid, according to some embodiments of the present disclosure.

Figure 24A:
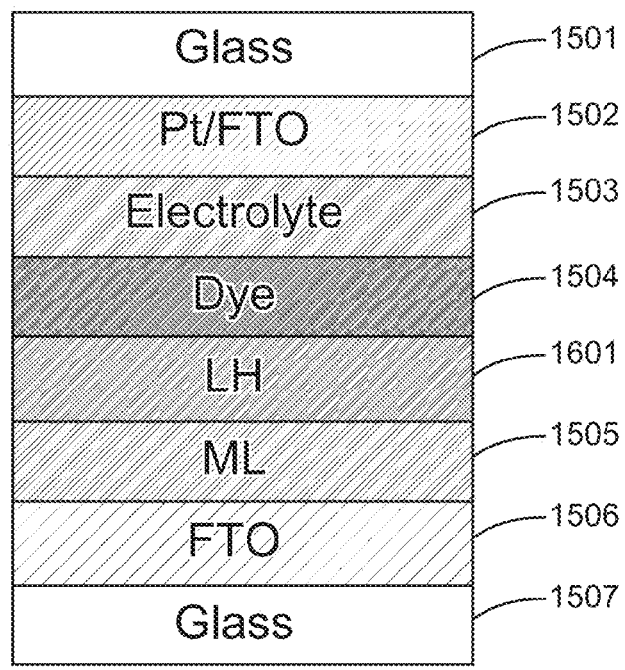

FIG. 24a is an example illustration of DSSC design according to some embodiments of the present disclosure.

Figure 24B:
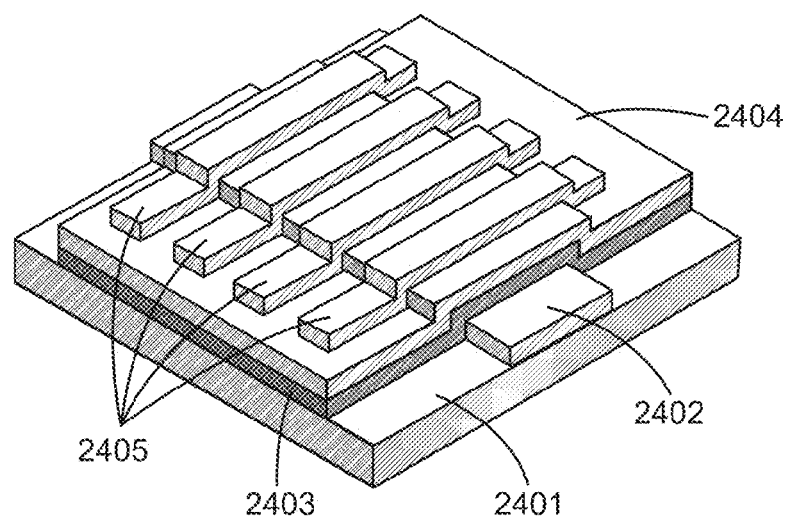

FIG. 24b is an example illustration of BHJ device design according to some embodiments of the present disclosure.

Figure 25:
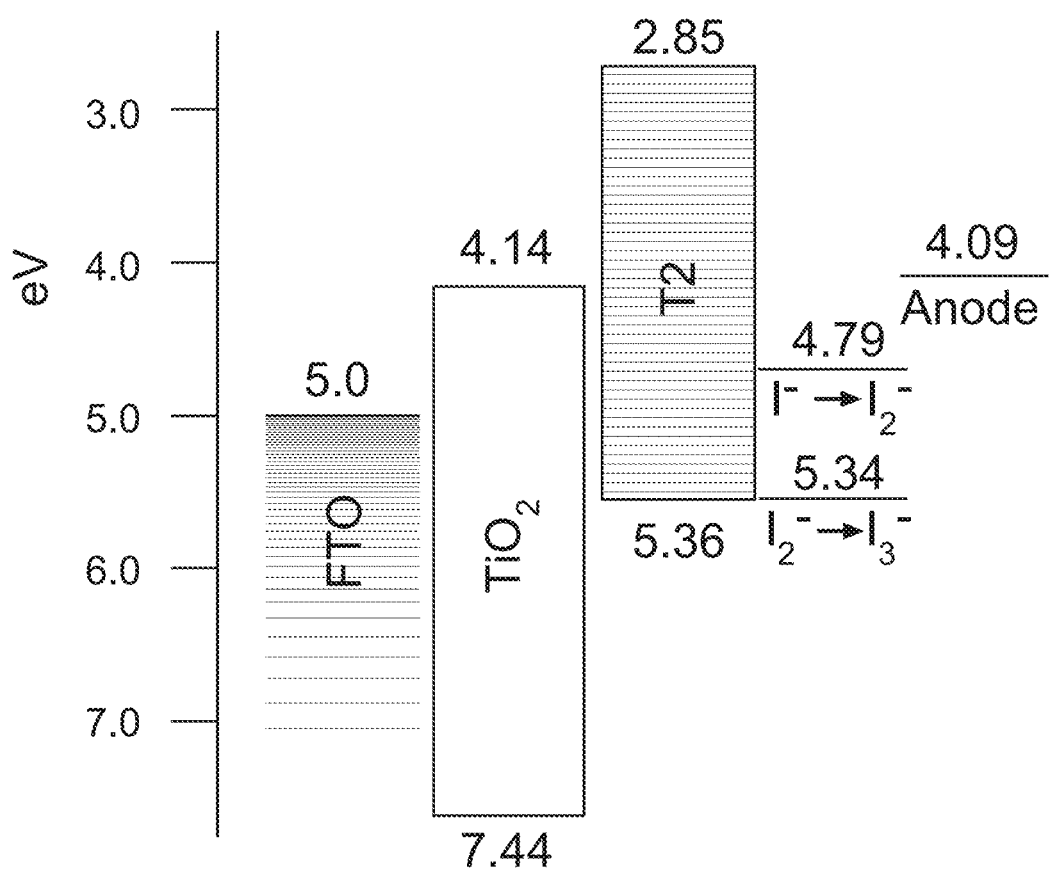

FIG. 25 is a representation of relative energy levels in eV of various components of an exemplar DSSC system that uses an iodide electrolyte according to some embodiments of the present disclosure. The data of FIG. 25 is derived from empirical results such as cyclic voltammetry or ultraviolet photoelectron spectroscopy.

Figure 26:
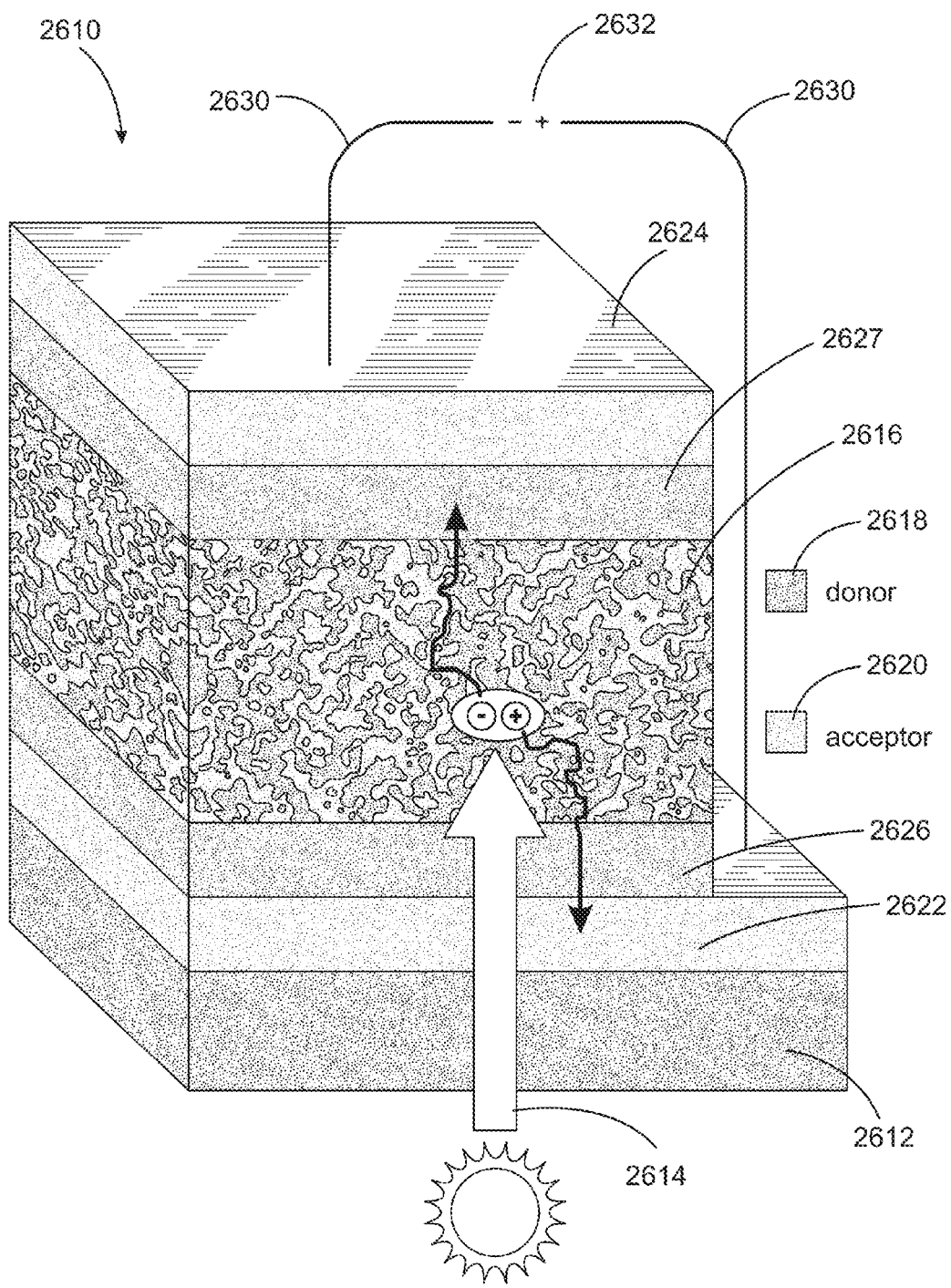

FIG. 26 is a schematic view of a typical photovoltaic cell including an active layer according to some embodiments of the present disclosure.

Figure 27:
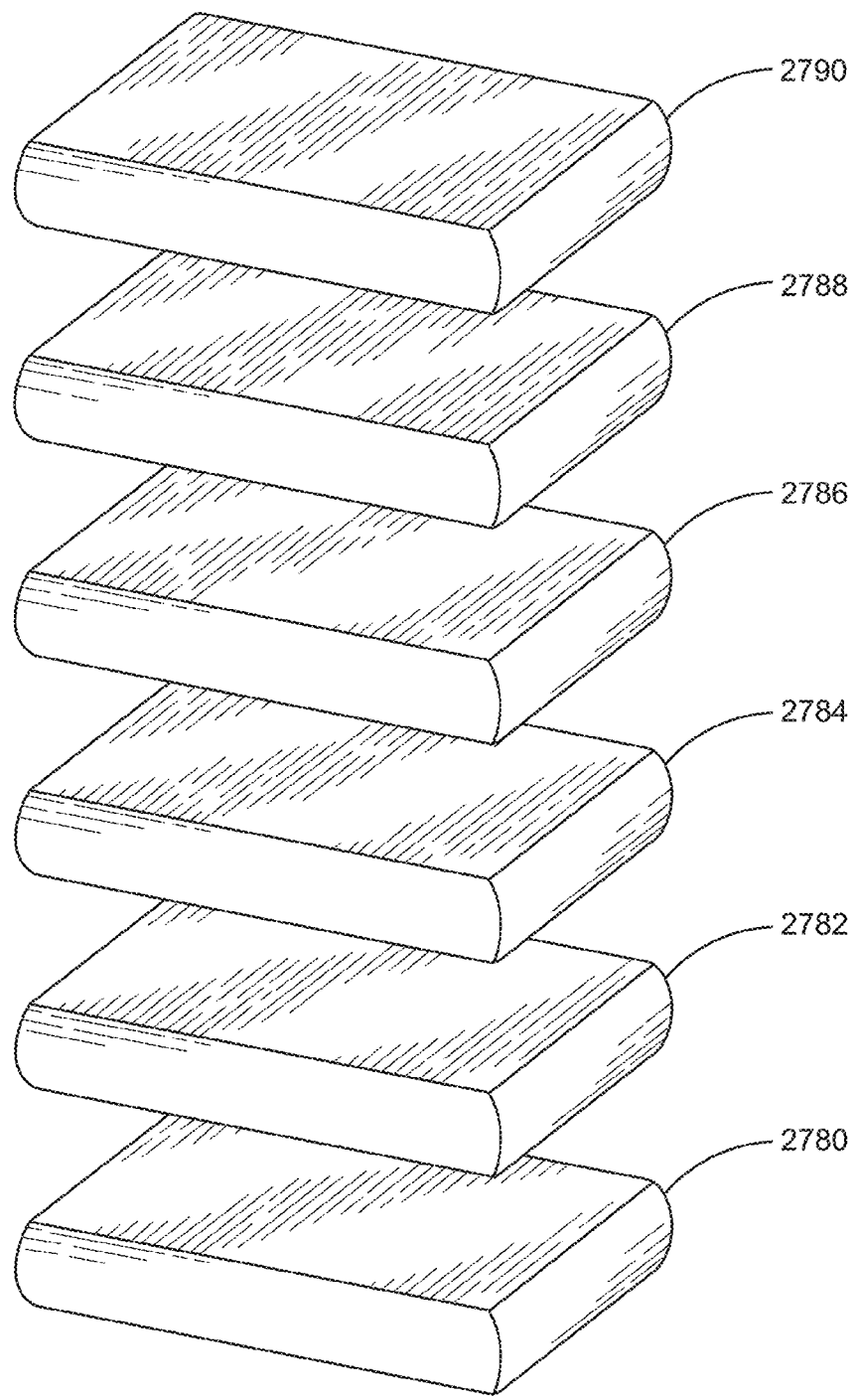

FIG. 27 is an exploded, representational view of a sample PV cell having a transparent conducting electrode, an electron blocking layer, a p-type thin film active layer, an n-type organic active layer, a hole blocking layer, and a low work-function layer according to some embodiments of the present disclosure.

Figure 28:
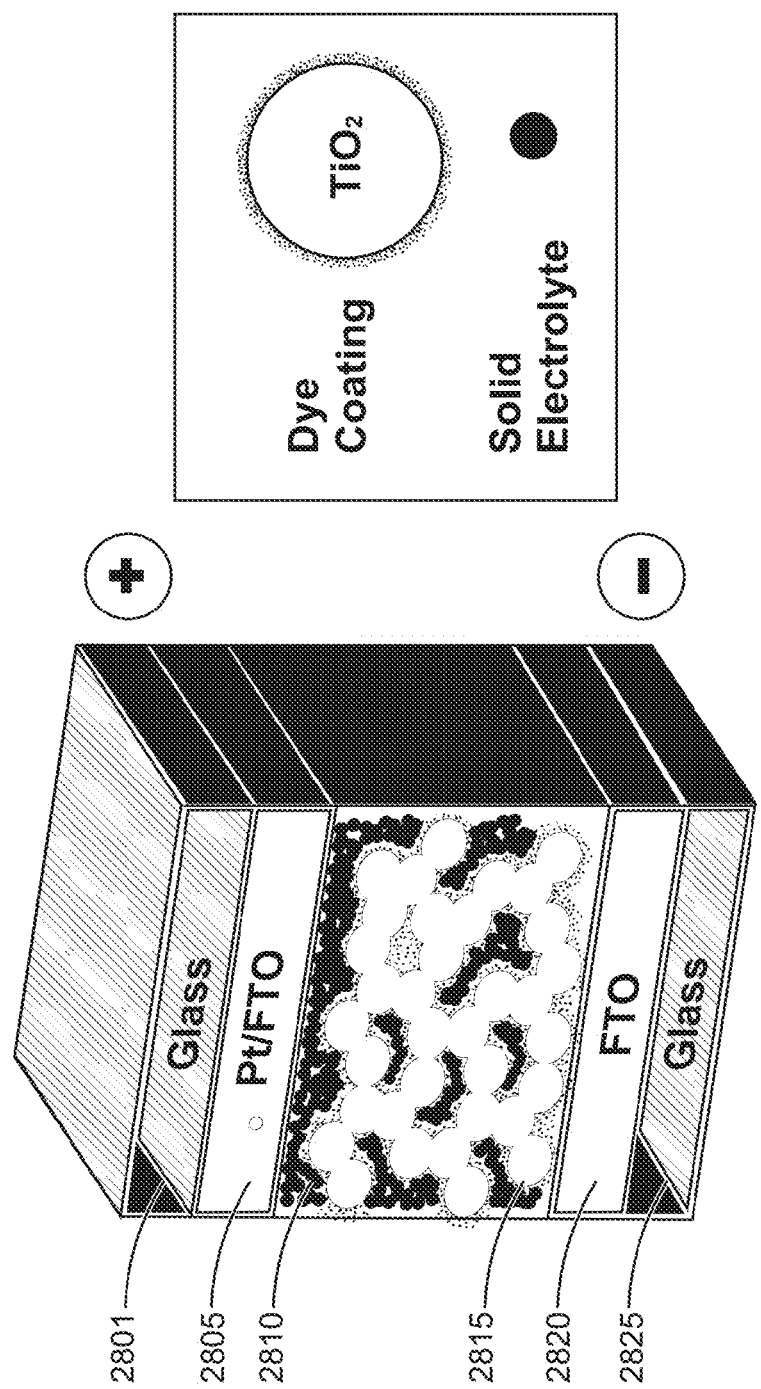

FIG. 28 is a schematic of a typical solid state DSSC device according to some embodiments of the present disclosure.

Figure 29:
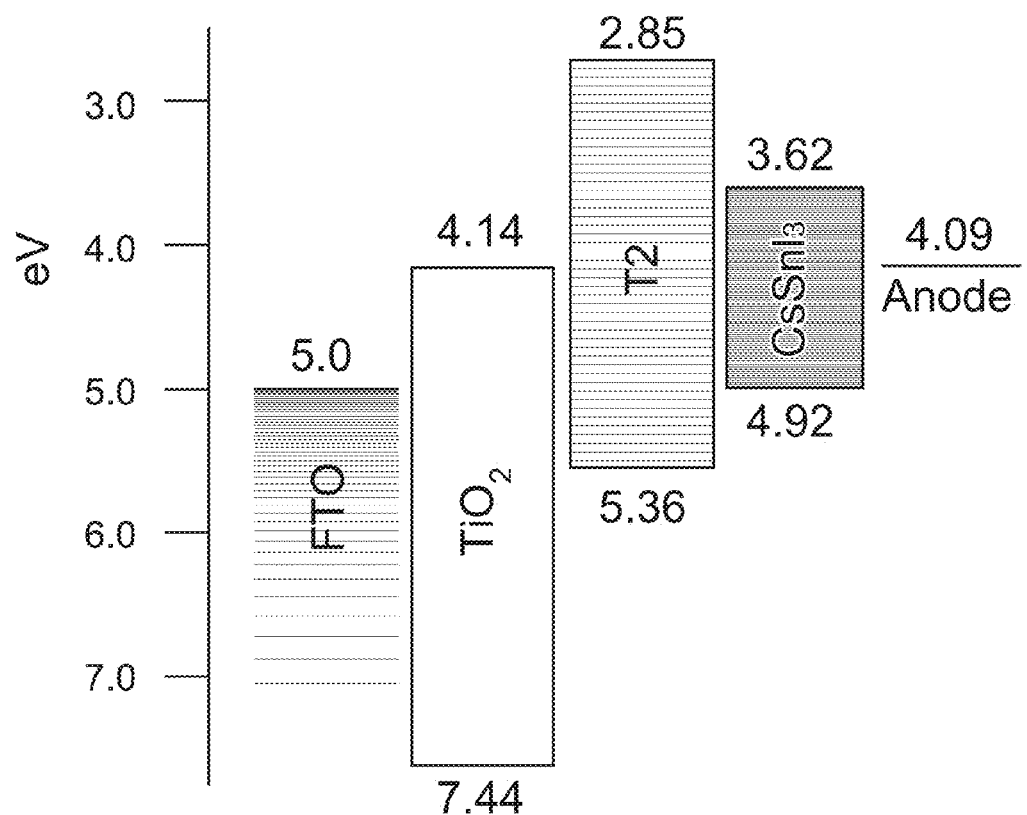

FIG. 29 is a representation of relative energy levels in eV of various components of an exemplar solid state DSSC system that uses a solid-state layer in accordance with some embodiments of the present disclosure. The data of FIG. 29 is derived from empirical results such as cyclic voltammetry or ultraviolet photoelectron spectroscopy.

Figure 30:
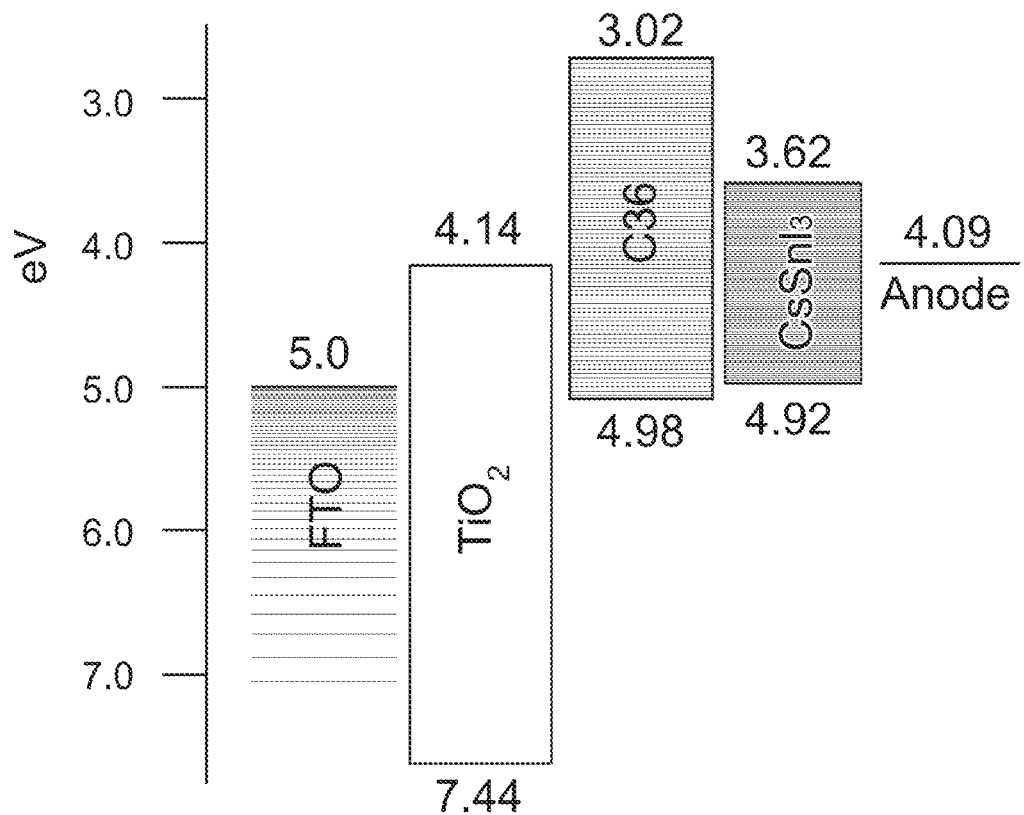

FIG. 30 is a representation of relative energy levels in eV of various components of another exemplar solid state DSSC system that uses a solid-state layer in accordance with some embodiments of the present disclosure. The data of FIG. 30 is derived from empirical results such as cyclic voltammetry or ultraviolet photoelectron spectroscopy.

Figure 31:
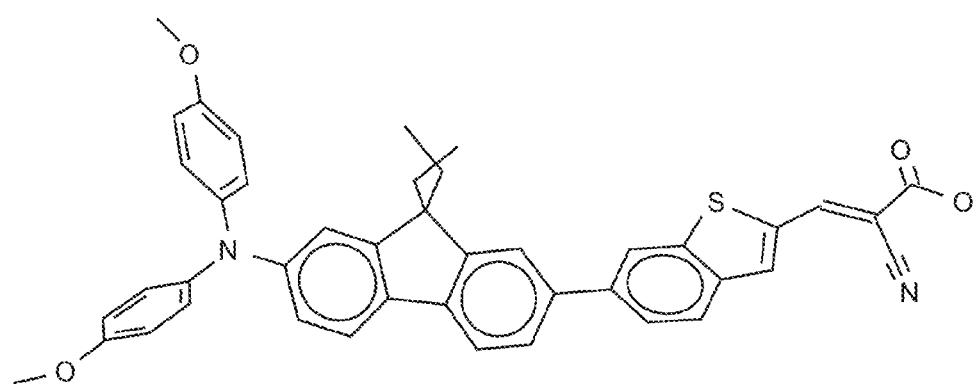

FIG. 31 is a chemical structure for (E)-2-cyano-3-[6-[9, 9-diethyl-7-(4-methoxy-N-(4-methoxyphenyl)anilino)fluoren-2-yl]benzothiophen-2-yl]prop-2-enoic acid.

DETAILED DESCRIPTION OF PREFERRED EMBODIMENTS

The present disclosure relates generally to compositions of matter, apparatus and methods of use of materials in organic photovoltaic cells in creating electrical energy from solar radiation. More specifically, this disclosure relates to photoactive compositions of matter, as well as apparatus and methods of use and formation of such compositions of matter, as well as methods for designing photoactive compositions of matter. In some embodiments, the present disclosure provides uses of photoactive compositions of matter in OPV devices including heterojunction cells, hybrid cells, and DSSCs. In embodiments concerning DSSCs, said photoactive compositions are compatible with traditional solvent-based electrolytes of $I_2$ or Co complexes, but additionally solid-state DSSC structures free of electrolyte, containing rather hole-transport materials such as spiro-OMeTAD or $CsSnI_3$. In other embodiments, the photoactive compositions of matter may be used in any organic electronic device, including but not limited to batteries, field-effect transistors (FETs), and light-emitting diodes (LEDs). The photoactive compositions of matter may, in some embodiments, be employed with additives (such as, in some embodiments, chenodeoxycholic acid or 1,8-diiodooctane).

In some embodiments, the present disclosure provides small-molecule photoactive compositions of matter. In some embodiments, the compositions of matter may be based upon polymeric or oligomeric materials. As used herein, "small-molecule" or "small molecule" refers to a finite molecular structure (e.g., acetone or benzene). It could, in some cases, also be referred to as a monomeric unit.

Figure 1:
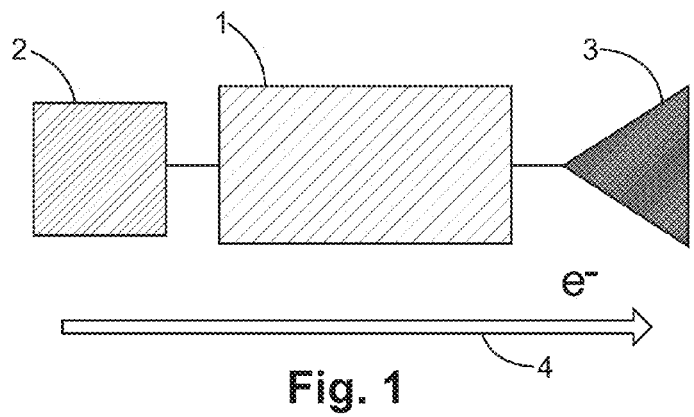
FIG. 1 is a general design scheme for a photoactive composition of matter of some embodiments of the present disclosure.

Referring to FIG. 1, in some embodiments, the compositions of matter of the present disclosure generally include: a primary electron donor moiety 2 a core moiety 1, and an electron withdrawing moiety 3. In some embodiments, the primary electron donor moiety 2 is chemically bound to the core moiety 1, and the core moiety is chemically bound to the electron-withdrawing moiety 3. In some embodiments, the electron donor moiety is located on the opposing end of the photosensitive compound from the electron-withdrawing moiety. In some embodiments, electrons generally flow within the photoactive composition from the primary electron donor moiety, to the core moiety, to the second electron donor moiety (if present), to the electron-withdrawing moiety, in accordance with the electron flow 4 depicted in FIGS. 1, 2, and 3.

Figure 2:
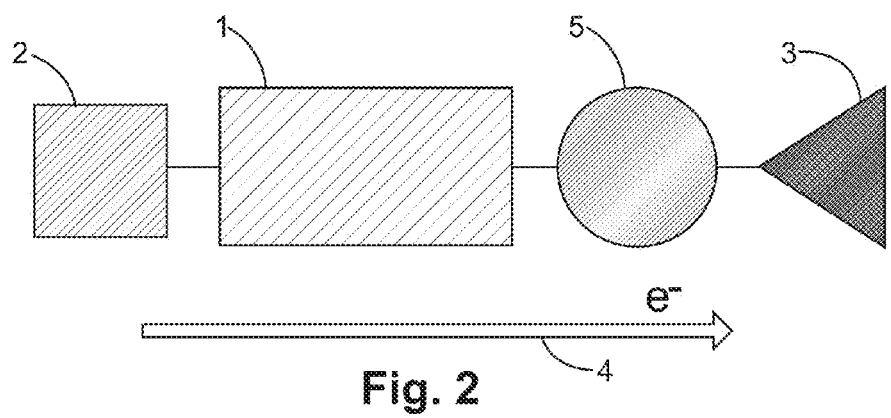
FIG. 2 is a general design scheme for a photoactive composition of matter of some embodiments of the present disclosure.
Figure 3:
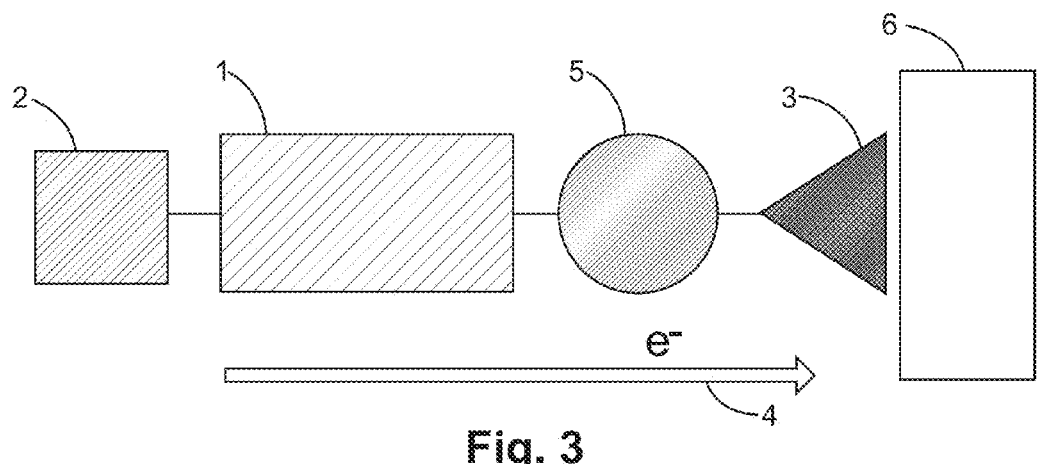
FIG. 3 is a general design scheme for a photoactive composition of matter of some embodiments of the present disclosure for use as a DSSC dye or BHJ semiconductor.

In some embodiments, the compositions of matter optionally may further comprise a second electron donor moiety 5, as shown in FIG. 2. In some embodiments, the primary electron donor moiety 2, core moiety 1, and electron withdrawing moiety 3 may be bonded to each other in the order shown in FIG. 1. In other embodiments, the second electron donor moiety 5 may be between the core moiety 1 and the electron-withdrawing moiety 3, as shown in FIG. 2. And in some embodiments, the electron-withdrawing moiety 3 may comprise a substituent capable of binding the photoactive composition to another substance 6, as shown in FIG. 3. In some embodiments, this substance 6 may be a mesoporous layer of a DSSC (which may be, for example, $TiO_2$). In some embodiments, the compositions of matter may comprise a second electron-withdrawing moiety instead of or in addition to a second electron donor moiety. In yet other embodiments, the composition may comprise three or more electron-withdrawing moieties bonded to each other. In some embodiments, each electron-withdrawing moiety may instead be located anywhere in the composition.

As used herein, "moiety" refers to the most general term to identify a molecular fragment (e.g., tri-aryl amine). It may include, but not necessarily be limited to, a substituent and/or a functional group. A "substituent" is any partial, identifiable fragment bonded (covalently, ionically, or otherwise) to a parent molecule (e.g., a methyl group), and a "functional group" is a molecular group that may be used to define the parent molecule (e.g., carboxylic acid). Thus, a substituent may include, but not necessarily be limited to, a functional group, and vice-versa. In addition, electron donor and electron-withdrawing moieties may generally be referred to as electron-rich and electron-poor, respectively.

Molecular Tunability and Composition Design

Figure 4:
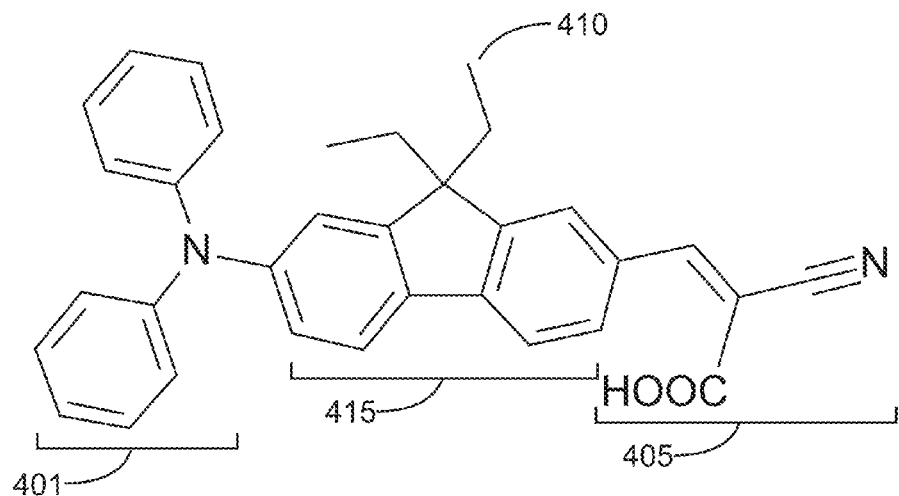
FIG. 4 is a chemical structure for the compound (Z)-2-cyano-3-[9,9'-diethyl-7-(N-phenylanilino)fluoren-2-yl]prop-2-enoic acid according to some embodiments of the present disclosure.

In some embodiments, the core moiety 1 intrinsically has all necessary characteristics to be employed in the various applications of the photoactive compositions of the present disclosure, such as a dye for a DSSC, or as a LED, or in any other application consistent with this disclosure as laid out previously. The photoactive compositions of these embodiments comprise the additional components identified in FIG. 1 (that is: a primary electron donor moiety 2, one or more electron withdrawing moieties 3, and, in some embodiments, an optional second electron donor moiety 5) in order to enhance or otherwise modify the intrinsic characteristics of the core moiety 1. These compositions, in some embodiments, further comprise one or more alkyl tails (for example, the 9,9-diethyl moieties 410 appended to the fluorene moiety 415 of FIG. 4 are alkyl tails of one embodiment, as are the 9,9-diethyl moieties 510 appended to the fluorene moiety 515 of FIG. 5). These additional components (primary and second electron donor moieties, electron withdrawing moiety, and alkyl tail or tails) may in some embodiments provide for a high degree of molecular tunability, allowing each composition of these embodiments to be finely tuned to its application, including obtaining desired properties relating to the composition's electronic properties, which include, but are not limited to: absorption window, molecular orbital energy levels (including band gap $E_g$, HOMO (Highest Occupied Molecular Orbital) and LUMO (Lowest Unoccupied Molecular Orbital) energy levels), and adjustment of intermolecular interactions such as intermolecular spacing. In some embodiments, selection and incorporation of these additional components may provide or affect additional electronic properties or other characteristics, such as the capability of bonding to another surface, molar absorptivity, modifying the molecular dipole, electron-donating and withdrawing capabilities, and generation and maintenance of excitons, among others. As used herein, "electronic properties" include any property or characteristic of a molecule that one of ordinary skill in the art would recognize as affecting or otherwise modifying a molecule's electronic, photoactive, conducting, dielectric or semiconducting characteristics.

Accordingly, some embodiments of the present disclosure provide methods for designing a photoactive composition comprising sourcing a core moiety, and further comprising selection of the additional components so as to tune the composition by enhancing the electronic properties of the photoactive composition as compared to the electronic properties of the core moiety alone.

The methods of selection of some embodiments comprise selecting components based upon one or more tunability considerations. Tunability considerations may, in some embodiments, comprise any one or more electronic properties. Non-limiting examples of such properties of the photoactive composition sought to be designed include: HOMO (Highest Occupied Molecular Orbital) energy level; LUMO (Lowest Unoccupied Molecular Orbital) energy level; band gap ($E_g$), which is the difference between HOMO and LUMO energies; absorption window (i.e., the allowed absorption wavelengths based on the band gap $E_g$); addition of semiconducting or conducting characteristics to the photoactive composition; polarizability; molar absorptivity; intermolecular spacing of the photoactive composition; oxidation susceptibility; reduction susceptibility; chirality or achiralty; exciton formation; exciton maintenance; molecular dipole moment; heat of solvation; structural volume; heat of formation; $V_{OC}$ (open-circuit voltage); $J_{SC}$ (Photocurrent density); Fill Factor percentage (FF %); and light-to-power conversion efficiency (PCE). Tunability considerations may, in some embodiments, further or instead comprise any other electronic property or properties of the photoactive composition sought to be designed. Although several such properties are expressly mentioned herein, one of ordinary skill in the art with the benefit of this disclosure would be capable of taking into account any other electronic property or properties in tunability considerations.

Tunability considerations of some embodiments may in addition or instead comprise any one or more of various conditions in the environment in which the photoactive composition is used or intended to be used. Such environmental conditions may, in some embodiments, comprise any one or more of the following: the presence of a solvent; the identity of the solvent (if present); the concentration of the photoactive composition in solution with a solvent (if present); the presence of a surface or other substance to which the photoactive composition is or is intended to be bonded, absorbed, adsorbed, or otherwise chemically or physically attached to a surface (such as, in some embodiments, $TiO_2$); the presence of additives (such as, in some embodiments, chenodeoxycholic acid or 1,8-diiodooctane).

Tunability considerations may be taken into account in the methods of some embodiments in various ways. In some embodiments, in order to modify the core moiety intrinsic characteristics, the additional components are selected for addition to the core moiety via covalent bonding in order to produce a photoactive composition with enhanced or otherwise modified properties. In some embodiments, to make the photoactive composition easier to oxidize and more difficult to reduce, electron-donating moieties are selected for addition to the composition; this can also, in some embodiments, induce p-type semiconducting character. Further, in some embodiments, one or more electron-withdrawing moieties are selected for addition in order to make the composition more difficult to oxidize and easier to reduce; this can also, in some embodiments, induce n-type semiconducting character. In other embodiments, electron-donating and electron-withdrawing moieties, 2 and 3, respectively, can be selected for addition together on opposite ends of the composition, as in FIG. 1, to fine-tune the molecular electronic characteristics beyond what either moiety can do alone. For example, a smaller band gap $E_g$ may result from addition of both an electron-donating and electron-withdrawing moiety than would result from the presence of only one of those two components. Additionally, in some embodiments, the motif illustrated in FIG. 1 can be designed to create a molecular dipole 4 of desired magnitude and direction (molecular dipoles are vector quantities). Further, in other embodiments, moieties such as alkyl chains, carboxylic acid groups, or aromatic groups can be selected and added to induce molecular ordering on a surface, such as Au, Ag, FTO (fluorine-doped tin oxide), ITO (indium tin oxide), $Nb_2O_5$ or $TiO_2$, as a layer or into supramolecular extended structures, such as metal organic frameworks, covalent organic frameworks, or crystalline structures.

Tunability considerations are taken into account in the design methods of other embodiments in order to maximize or otherwise alter the electronic properties of the photoactive composition. For instance, in some embodiments, it is desirable to minimize the band gap ($E_g$), which as noted above is the energy difference between the HOMO energies and the LUMO energies, in order to red shift the light absorption maximum and therefore achieve increased current in the photoactive composition through a broader spectral window. In some embodiments, this may comprise creating a deeper (that is, greater absolute value in eV) LUMO level energy, for example to facilitate electron transfer from an electron donor or electrode. In other embodiments, a deeper HOMO is desired, for example to allow unimpeded hole transfer to another semiconducting material or to an electrode. In some embodiments, it is beneficial to have a shallower LUMO energy, for example to allow electron transfer to an electron accepting material or electrode. In other embodiments, it is beneficial to have a shallower HOMO energy, for example to facilitate the acceptance of a hole from a semiconducting material or electrode.

The methods of other embodiments may comprise tuning the composition's band gap $E_g$, its absorption window, or both, by selecting and/or incorporating any one or more of the following into the composition: a primary electron donor moiety, a second electron donor moiety, an electron-withdrawing moiety, and a second electron-withdrawing moiety. The methods of yet other embodiments may comprise selecting and/or incorporating more than two of either or both of electron donor moieties and electron-withdrawing moieties. Any one or more other tunability considerations may also or instead be accounted for by selecting and/or incorporating any one or more of the primary electron donor moiety, second electron donor moiety, and electron-withdrawing moiety. The methods of some embodiments may further comprise tuning the composition's intermolecular interactivity by selecting and incorporating one or more alkyl tails. The methods of other embodiments may comprise tuning the composition's intermolecular interactivity by selecting and incorporating any one or more of the core moiety or any additional component. For example, in some embodiments, carboxylic acids may cause molecules of the photoactive composition to dimerize. In other embodiments, for example, a primary electron donating moiety comprising an anthracene moiety instead of a naphthyl moiety may increase the attraction between two molecules of the photoactive composition.

Selection of one or more electron donor moieties and/or electron-withdrawing moieties may, in some embodiments, be carried out in order to alter the band gap $E_g$ of the photoactive composition. This may be accomplished, for example, by modifying either or both of the HOMO or LUMO. For example, in some embodiments, a shallower HOMO (that is, greater electron density) for the photoactive composition as a whole is desirable. In such embodiments, a primary electron donor moiety that is selected and incorporated into the photoactive composition may comprise any one or more of the following: alkyl amines, alkyl aryl amines, and aryl amines. The primary electron donor moieties of other embodiments may be selected and incorporated such that they comprise any one or more of the following: anisole aryl amines, including other alkoxy derivatives greater than methyl, di- and tri-alkyl derivatives; alkyl and other hydrocarbon phenyl substituents; halogen substituents; and either p-, o-, or m-covalent bonding. In other embodiments, the electron-withdrawing moiety may be selected and incorporated in order to adjust the LUMO. For example, in order to make the LUMO very shallow, a strong electron-withdrawing moiety (that is, an electron-withdrawing group with a greater electron affinity relative to other moieties of the photoactive composition) should be selected. Examples of strong electron-withdrawing moieties include any one or more of the following: dicyanomethane, cyano acrylate, dicarboxylic acid, as well as halogen acrylates. Weaker electron-withdrawing moieties (that is, electron-withdrawing moieties that would make the LUMO less shallow) include, but are not limited to, any one or more of the following: carboxylic acid, amides, esters, and halogenated hydrocarbons. In some embodiments wherein alteration of the $E_g$ is desired (by, for example, making $E_g$ smaller), alteration of only one of the LUMO or HOMO energy level may be targeted. In some embodiments, various tunability considerations may be inter-dependent (that is, at least one tunability consideration may depend on at least one other tunability consideration).

The following example illustrates the interplay and specificity of the tunability considerations of some embodiments. FIG. 25 is a representation of relative energy levels in eV of various components of an exemplar DSSC system that uses an iodide electrolyte: FTO (fluorine-doped tin oxide); $TiO_2$ (titanium dioxide); T2 (an embodiment of a photoactive compound of the present disclosure); iodide electrolyte (illustrated by oxidation reactions $I^-\rightarrow I_2^-$ and $I_2^-\rightarrow I_3^-$); and the Anode. The data shown in FIG. 25 was derived from empirical results such as cyclic voltammetry or ultraviolet photoelectron spectroscopy. In FIG. 25, relative conduction band and LUMO energy values of $TiO_2$ and T2 (4.14 and 2.85, respectively) are toward the top of the graph, and valence band and HOMO energy values are toward the bottom (7.44 and 5.36, respectively), with eV values of iodide electrolyte reduction of T2 and eV values at the Anode and FTO also being shown. The T2 is employed in this example embodiment as a DSSC dye. As can be seen in FIG. 25, shallower HOMO energies in T2 would not allow for reduction of the oxidized T2 by the $I_2^-\rightarrow I_3^-$ couple, so a shallower HOMO energy level would not be desired. However, a deeper LUMO energy level would result in a reduction in $E_g$ in the T2, which could in some embodiments lead to a greater PCE. Thus, the nature of the application in which the photoactive composition is deployed may provide additional tunability considerations, demonstrating in this example that modification of the design of T2 should target deeper LUMO energy levels but not shallower HOMO energy levels. In other instances—such as use in a solid-state DSSC in accordance with some embodiments of the present disclosure—the photoactive compound may be designed to target shallower HOMO energy levels due to the presence of, for example, a solid electrolyte (as opposed to a liquid electrolyte such as the iodide electrolyte depicted in FIG. 25). FIG. 29, for example, shows the shallower HOMO energy level of a solid electrolyte of some embodiments ($CsSnI_3$), which permits a photoactive compound of the present disclosure (e.g., T2, as shown in FIGS. 25 and 29) to be designed with a shallower HOMO. Thus, the use of a solid electrolyte could, in some embodiments, open greater design possibilities and permit targeting a shallower HOMO energy level (and therefore, in some embodiments, an even smaller $E_g$). This could provide significant advantages in the PCE values of solid state DSSCs employing a photoactive composition of matter according to the present disclosure. FIG. 29 and solid-state DSSC embodiments are discussed in greater detail elsewhere in this disclosure.

In some embodiments, selection of any one or more of the primary electron donor moiety, the second electron donor moiety, and the electron-withdrawing moiety may have effects on the overall photovoltaic power conversion efficiency (PCE) of the photoactive composition when used in, for example, OPV applications. In some embodiments, it may be desirable to design the composition so as to maximize its PCE when used in OPV applications. The effects on the PCE of various design elements alone or in combination with other design elements may not be readily determinable without calculation and experimentation. Thus, the present disclosure further provides, in some embodiments, a method for carrying out the necessary experimentation and calculation to optimize selection of any one or more of: the core moiety, the electron-withdrawing moiety, the primary electron donor moiety, and the second electron donor moiety. Therefore, such calculation and experimentation would be routine to one of ordinary skill in the art with the benefit of this disclosure.

Figure 6:
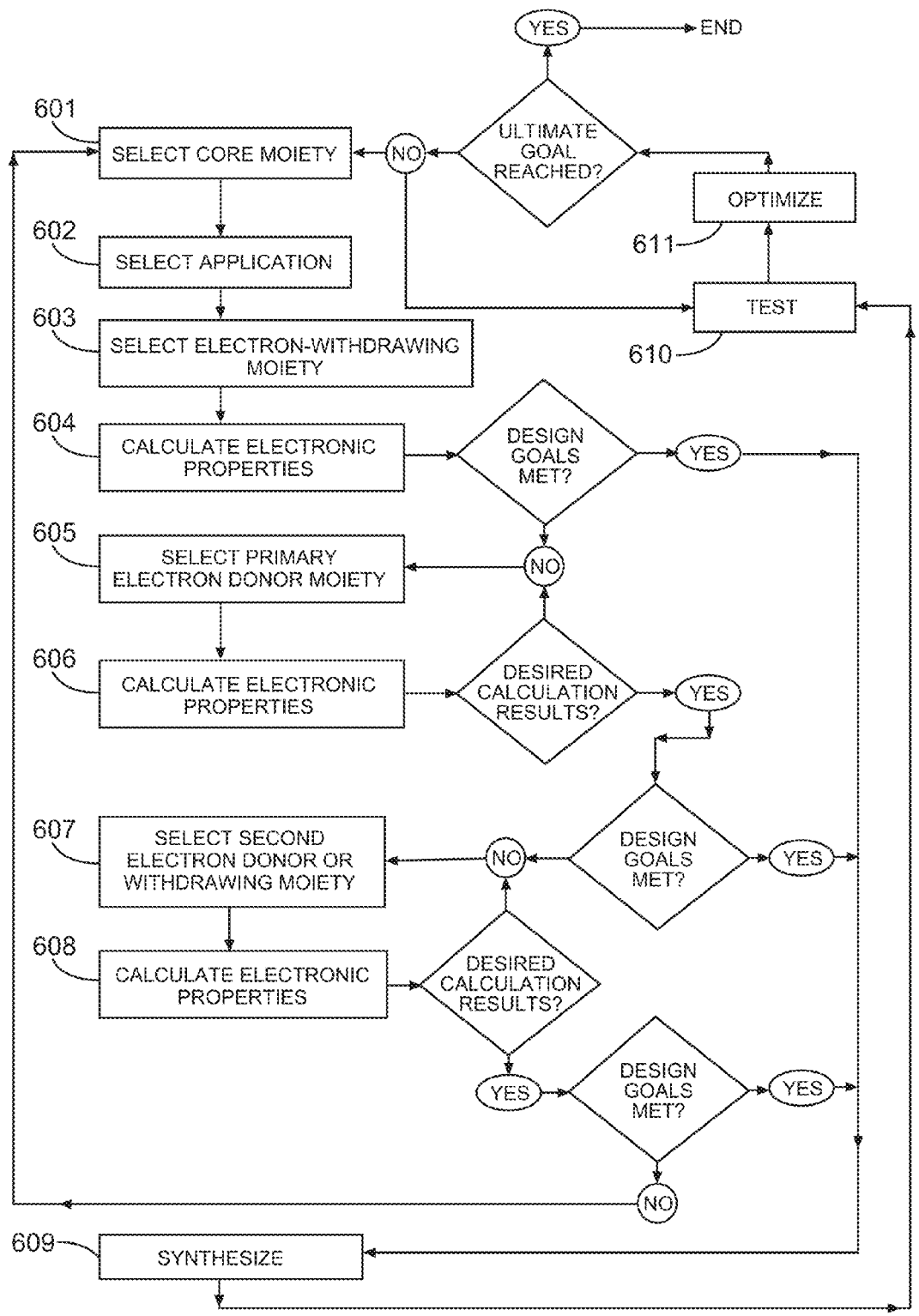
FIG. 6 depicts an exemplary method for designing photoactive compounds according to some embodiments of the present disclosure.

Referring to FIG. 6, this method, in some embodiments, may comprise a photoactive core moiety selection step 601. In some embodiments, this step 601 may further comprise selecting a photoactive core moiety from asphaltenes. Thus, for example, a range of potentially useful core moieties selected from asphaltenes may include, but not necessarily be limited to, any one or more of the following: fluorene, benzothiophene, dibenzothiophene, naphthothiophene, dinaphthiophene, and benzonaphthothiophene.

In other embodiments, the method may further comprise an application selection step 602 comprising, in some embodiments, determining one or more applications for the photoactive composition (e.g., BHJ, DSSC, FET). In some embodiments, the method may further comprise an electron-withdrawing moiety selection step 603. In some embodiments, the electron-withdrawing moiety is selected based at least in part upon the application selected at 602. For example, in embodiments wherein DSSC is selected at 602, it may be desirable to select an electron-withdrawing moiety that comprises a carboxylic acid substituent, which may enable bonding to another surface, examples of which include, but are not limited to, Au, Ag, FTO (fluorine-doped tin oxide), ITO (indium tin oxide), $Nb_2O_5$, or $TiO_2$ as a layer or into supramolecular extended structures, such as metal organic frameworks, covalent organic frameworks, or crystalline structures. In other embodiments, an electron-withdrawing moiety comprising a cyanoacrylate, boronic acid, sulfate, phosphate, nitrate, halogen silane, or alkoxy silane may be selected to enable surface bonding. Furthermore, in some embodiments, notwithstanding the depiction of FIG. 6, the application selection step 602 may be carried out prior to the core moiety selection step 601.

In some embodiments, the method may further comprise a first electronic property calculation step 604, which may comprise calculating the electronic properties of a composition comprising the core moiety selected at step 601 and the electron-withdrawing moiety selected at step 603. Electronic properties calculated in this step may, in some embodiments, include the electronic properties previously discussed and which are calculable. Thus, in some embodiments, electronic properties calculated in this step may comprise any one or more of the following: HOMO structure, LUMO structure, HOMO energy, LUMO energy, band gap $E_g$, molar absorptivity, allowed absorption wavelengths, intermolecular spacing, molecular dipole, heat of solvation, structural volume, and heat of formation. In some embodiments, other electronic properties already discussed may also be calculated in this step.

In some embodiments, the method may further comprise a primary electron donor moiety selection step 605, which in some embodiments may be based at least in part upon the result of the electronic property calculation step 604. In some embodiments, the primary electron donor is selected in order to modify the HOMO of the photoactive composition. In addition, the method of some embodiments may further comprise a second electronic property calculation step 606, which comprises calculating the electronic properties of the composition comprising the core moiety selected at step 601, the electron-withdrawing moiety selected at step 603, and the primary electron donor moiety selected at step 605.

This second electronic property calculation step 606 may, in some embodiments, be iteratively repeated in alternation with the primary electron donor moiety selection step 605, such that a different primary electron donor moiety is selected based at least in part upon the results of the second electronic property calculation step 606, followed by another iteration of the second electronic property calculation step 606, which may in some embodiments lead to again repeating the primary electron donor selection step 605. In some embodiments, this repetition continues until a desired result of the second electronic property calculation step 606 is reached. Desired results of the second electronic property calculation step may, in some embodiments, be based upon the tunability considerations previously discussed. Thus, returning to the example of minimizing the band gap ($E_g$) in order to red shift the light absorption maximum and therefore achieve increased current in the photoactive composition through a broader spectral window, a desired result would therefore comprise a minimized band gap $E_g$ value. In some embodiments, the calculation results may furthermore indicate that overall design goals have been met, for example, by indicating a desired $E_g$ value, PCE value, or other electronic property value has been obtained. If this is the case, the method may in some embodiments proceed directly to a synthesis step 609.

The method in some embodiments may comprise a second electron donor or withdrawing moiety selection step 607. This step may in some embodiments comprise selection of either or both of a second electron donor moiety or a second electron-withdrawing moiety. Results of the second electronic property calculation step 606 may, in some embodiments, form at least part of the basis for determining whether a second electron donor moiety, a second electron-withdrawing moiety, or both, should be selected at the second electron donor or withdrawing moiety selection step 607. Results of the second electronic property calculation step 606 may also or instead form at least part of the basis for determining which second electron donor moiety, second electron-withdrawing moiety, or both, should be selected. In addition, this step, in some embodiments, may further comprise a third electronic property calculation step 608, which comprises calculating the electronic properties of the composition comprising any component so far selected. Thus, in some embodiments, the calculation may be based upon a photoactive composition comprising any one or more of: the core moiety selected at step 601; the electron-withdrawing moiety selected at step 603; the primary electron donor selected at step 605; and the second electron donor moiety and/or second electron-withdrawing moiety selected at step 607.

This third electronic property calculation step 608 may, in some embodiments, be iteratively repeated in alternation with the second electron donor or withdrawing moiety selection step 607, such that a different second electron donor moiety, second electron-withdrawing moiety, or both, is selected based at least in part upon the results of the third electronic property calculation step 608, followed by another iteration of the third electronic property calculation step 608, which may in some embodiments lead to again repeating the second electron donor or withdrawing moiety selection step 607. In some embodiments, this repetition continues until a desired result of the third electronic property calculation step 608 is reached. As with the second electronic property calculation step 606, desired results of the third electronic property calculation step 608 may, in some embodiments, be based at least in part upon tunability considerations. Again, desired values may in some embodiments differ depending upon the tunability consideration and the target.

In some embodiments, the selection and calculation steps 601 and 603 through 608 may be carried out at least in part by using molecular modeling software. Non-limiting examples of molecular modeling software include Spartan, Jaguar, and Gaussian. Calculations are, in some embodiments, based on Density Functional Theory, method: RB3LYP, and basis set: 6-31G*.

The method of some embodiments may further comprise a synthesis step 609. In some embodiments, this step comprises synthesizing one or more molecules that comprise the component or components selected in any one or more of the previous steps 601, 603, 605, and 607. In some embodiments, this synthesis step 609 is carried out once any one or more of the first electronic property calculation step 604, the second electronic property calculation step 606, and the third electronic property calculation step 608 result in a desired value or set of values to meet the design goals of the photoactive composition. Design goals of the photoactive composition may include a desired value of any one or more electronic properties, which in some embodiments may depend at least in part upon the application selected for the composition at the application selection step 602. For example, in some embodiments, where the composition is to be used in a DSSC, a minimum desired PCE, such as, e.g., 7.5% may be a design goal. Other examples may include a maximum desired band gap, or a specific HOMO and/or LUMO energy level to allow compatible charge transfer with another substance. Design goals may also include, in some embodiments, simply the existence of a molecular dipole moment, and in some embodiments, that dipole moment may be of a desired minimum value.

The design goals may or may not be the same as the desired calculation results; thus, for example, a desired calculation result of a band gap below a desired maximum value (in eV) might not result in a molecule that, when applied to an OPV, would exhibit a minimum desired PCE value. Thus, in some embodiments, if, after steps 601 through 608 are performed and, although desired results of the third calculation step 608 are reached, design goals are not reached, then the method of these embodiments may further comprise repeating any one or more of steps 601 through 608 in accordance with the description of various embodiments above. For example, referring to FIG. 6, an embodiment is shown wherein, if design goals are not met even after the third electronic property calculation step 608 achieves desired results, the process repeats at the core moiety selection step 601.

In some embodiments, the method may further comprise a testing step 610 wherein, in some embodiments, the molecule or molecules are tested in the one or more applications selected at the application selection step 602.

In some embodiments, the method may further comprise an optimization step 611, wherein the device or application in which the photoactive composition is tested is optimized by various means. Such means include, but are not necessarily limited to, any one or more of the following: radiation, thermal or chemical treatments, or interfacial modification or additives. In some embodiments, optimization may comprise the addition of one or more alkyl tails to the photoactive composition. In some embodiments, the alkyl tails may be added to the core moiety of the photoactive composition.

In some embodiments, the method may further comprise repeating the testing step 610 following optimization step 611. In some embodiments, optimization step 611 and testing step 610 may be repeated one or more times until ultimate goals are met. In some embodiments, after zero or more repetitions of the alternating optimization step 611 and testing step 610 in this manner, if ultimate goals are still not met, the process repeats from the beginning.

Furthermore, the method of some embodiments may additionally comprise an alkyl tail selection step (not shown in FIG. 6) instead of or in addition to alkyl tail addition, if any, in optimization step 611. In some embodiments, this step may take place before synthesis step 609. In some embodiments, the alkyl tail selection step may comprise selecting any one or more alkyl tails to be appended to the composition. In some embodiments, the alkyl tail or tails may be selected for addition to the core moiety of the composition. Selection of an alkyl tail or tails may be based at least in part upon the calculation results of any one or more of electronic property calculation steps 604, 606, and 608. In some embodiments, the alkyl tail selection step may further comprise selecting the location on the composition at which to append the alkyl tail or tails. The alkyl tail selection step also may comprise an additional electronic property calculation step, which may be carried out similarly to any of electronic property calculation steps 606 and 608 (that is, iteratively calculating electronic properties, changing alkyl tail selection, and re-calculating electronic properties).

It will be apparent to one of ordinary skill in the art that the above-outlined methods are merely example embodiments. Various alterations are contemplated by this disclosure. Thus, although the example embodiment outlined in FIG. 6 proceeds with later calculations based upon a selected electron-withdrawing moiety at step 603, and contemplates selection of different primary electron donor moieties and second electron donor moieties depending upon results of later calculations, the method could instead proceed whereby a different electron-withdrawing moiety is selected when desired calculation results are not met in any of steps 604, 606, or 608.

The systems and methods of the present disclosure described above may be implemented in software to run on one or more computers, where each computer includes one or more processors, a memory, and may include further data storage, one or more input devices, one or more output devices, and one or more networking devices. The software includes executable instructions stored on a tangible medium.

Methods of various embodiments consistent with this disclosure are further elaborated in the context of the below discussion of various components of the compositions of matter of certain embodiments of the present disclosure.

Core Moiety

In some embodiments, the core moiety may comprise fluorene. In other embodiments, the core moiety may comprise any one of: benzothiophene, dibenzothiophene, naphthothiophene, dinaphthothiophene, benzonaphthothiophene, biphenyl, naphthyl, benzene, benzothiazole, benzothiadiazole, benzo[b]naphtha[2,3-d]thiophene, 4H-cyclopenta[1,2-b:5,4-b']bisthiophene, dinaphtho[2,3-d]thiophene, thieno[3,2-b]thiophene, naphthalene, or anthracene. In other embodiments, the core moiety may comprise any other multi-cyclic aromatic ring. In some embodiments, the core moiety comprises a compound or compounds extracted from asphaltenes.

Alkyl Tails and Alkyl Tail Selection

In some embodiments, the core moiety may further comprise one or more alkyl tails. In some embodiments, an alkyl tail is a substituent comprising a carbon backbone and that is bonded to a single carbon atom of any of the following: a core moiety; a primary electron donor moiety; an electron donor moiety; and an electron-withdrawing moiety. In some embodiments, the distal end of the carbon backbone of the alkyl tail is not covalently bonded to another compound. In some embodiments, two alkyl tails are bonded to the same carbon atom. For example, in some embodiments in which the core moiety comprises fluorene, the core moiety may additionally comprise two alkyl tails appended at the 9,9' carbon of the fluorene molecule (e.g., a 9,9'-dialkyl functionalized fluorene). By way of example, FIG. 4 depicts a composition of some embodiments of the present disclosure, which includes a fluorene 415 functionalized with diethyl alkyl tails 410 at the 9,9' carbon of the fluorene. Similarly, the embodiment depicted in FIG. 5 includes a fluorene 515 functionalized with diethyl alkyl tails 510 at the 9,9' carbon of the fluorene. Appending an alkyl tail or tails to the 9,9' carbon of fluorene may be advantageous because the hydrogen atoms appended thereto are acidic, and may be more readily substituted by alkyl tails.

However, different advantages such as greater molecular spacing may be achieved by appending an alkyl tail or tails to different locations on the core moiety, or on different locations of the photoactive composition, depending upon the makeup of the photoactive composition. Thus, in some embodiments, the alkyl tail or alkyl tails appended to the photoactive composition of matter may be appended on any carbon of the core moiety in place of one or more hydrogen atoms (that is, the alkyl tail or tails replace a hydrogen or hydrogens bonded to the carbon). The alkyl tail or tails may, in other embodiments, be appended to any carbon, or other atom, bonded to one or more hydrogens within the photoactive composition of matter (e.g., a carbon, or other atom, of the substituent that constitutes the primary electron donor moiety of some embodiments). In yet other embodiments comprising multiple alkyl tails, the alkyl tails may be appended to different carbon, or other, atoms within the composition.

The alkyl tail or tails of some embodiments may comprise $C_2$ to $C_{10}$ hydrocarbons, including various isomers. The alkyl tails of other embodiments may comprise $C_2$ to $C_{15}$ hydrocarbons, or, in other embodiments, $C_2$ to $C_{20}$ hydrocarbons. In yet other embodiments, the alkyl tails may comprise $C_2$ to $C_{30}$ hydrocarbons, or, in other embodiments, $C_2$ to $C_{40}$ hydrocarbons. As used herein, a "$C_2$" hydrocarbon is a hydrocarbon containing 2 carbon atoms; a $C_{10}$ hydrocarbon is a hydrocarbon containing 10 carbon atoms, and, in general, a $C_x$ hydrocarbon is a hydrocarbon containing x carbon atoms, where x is an integer. The alkyl tail or tails of some embodiments may comprise more than 40 carbons.

In some embodiments, the $C_2$ to $C_{10}$ hydrocarbons are linear or branched hydrocarbon chains. Thus, the alkyl tail or tails of some embodiments may comprise a $C_2$ to $C_{10}$ linear chain (that is, a hydrocarbon chain that is 2 through 10 carbon atoms long), with hydrocarbon branches of various lengths appended to various carbons on the $C_2$ to $C_{10}$ linear chain. Thus, when an alkyl tail of some embodiments comprises a $C_4$ hydrocarbon, those embodiments may comprise any of the various possible isomers of $C_4$ hydrocarbons. That is, a $C_4$ alkyl tail of some embodiments may comprise a butyl group, or it may comprise a branched alkyl tail such as a methylpropyl group. Again, various isomers of a methylpropyl group may be used in various embodiments (e.g., the methyl group may be appended to any carbon of the propyl group).

Figure 19:
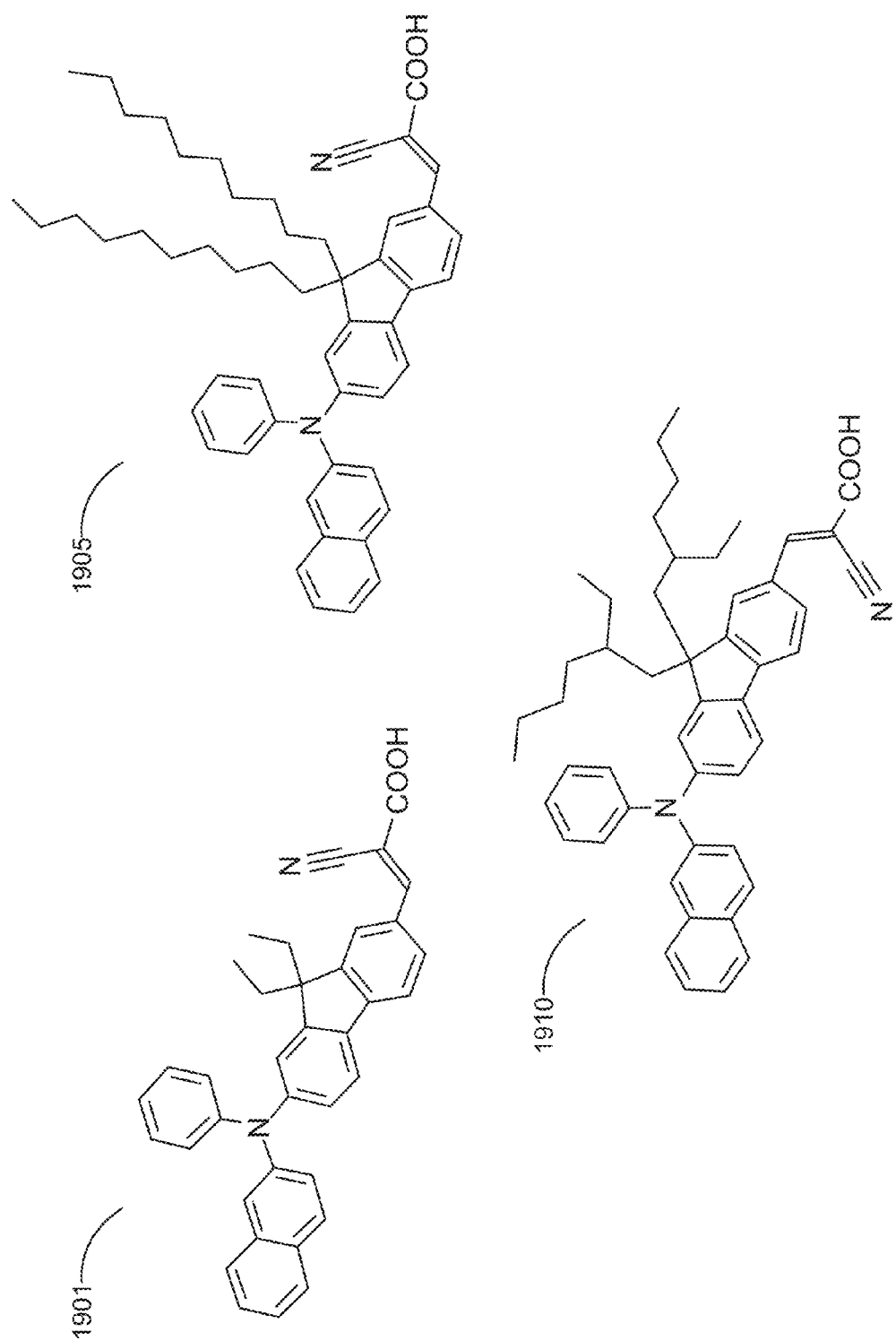
FIG. 19 illustrates chemical structures for (E)-2-cyano-3-[9,9'-R,R'-7[N-(2-naphthyl)aniline]fluoren-2-yl]prop-2- enoic acid, where R signifies a dialkyl tail of various isomers of $C_2$ to $C_{10}$ compounds, according to some embodiments of the present disclosure.

Returning to the example embodiments in which the core moiety comprises a fluorene, in embodiments employing $C_2$ alkyl tails, the core moiety could comprise a 9,9'-diethyl fluorene. Likewise, in embodiments wherein the alkyl tails each comprise a $C_3$ hydrocarbon, the core moiety of such embodiments may comprise a 9,9'-dipropyl fluorene, or in other embodiments (using another $C_3$ isomer), a 9,9'-dimethylethyl fluorene. Any other $C_2$ to $C_{10}$ isomer may be used. Or, in other embodiments, any other $C_2$ to $C_{15}$, $C_2$ to $C_{20}$, $C_2$ to $C_{30}$, or $C_2$ to $C_{40}$ isomer may be used. FIG. 19 depicts the use of various alkyl tails on the fluorescent moiety of various embodiments of photoactive compositions, such as ethyl ($C_2$), decyl ($C_{10}$), and ethylhexyl ($C_8$, branched) alkyl tails.

In some embodiments, an alkyl tail or tails may provide spacing between different molecules of this photoactive composition. This may, for example, increase the light-to-power conversion efficiencies (PCEs) of PV cells comprising the photoactive composition. The spacing provided by the alkyl tail or tails may vary depending upon the makeup of the photoactive composition of some embodiments (e.g., different alkyl tails may be ideal for compositions comprising different primary electron donating moieties). In addition, the alkyl tail or tails may provide enhanced solubility when the photoactive compositions of the present disclosure are employed in the presence of a solvent (such as, for example, where the photoactive compositions are used or intended to be used in a DSSC, BHJ, or hybrid OPV device). The alkyl tail or tails of some embodiments may therefore depend upon the identity of the solvent used. Possible solvents include, but are not limited to: dichlorobenzene, chlorobenzene, toluene, methylene chloride, chloroform, acetonitrile, ethanol, methanol, and water.

Thus, the present disclosure in some embodiments also provides for methods for selecting the ideal alkyl tail based at least upon the following considerations: makeup of the photoactive composition (and/or its constituent parts, such as the identity of the primary electron donor moiety), ability to be sublimed, and the characteristics of the solvent, if any, into which the photoactive composition is to be employed. These methods may in some embodiments be employed on their own, or in other embodiments employed in connection with the methods for selecting a primary electron donor moiety and an electron withdrawing moiety, discussed previously.

In some embodiments, the alkyl tail selection method comprises selecting an alkyl tail based in part upon the size of the primary electron-donating moiety of the photoactive composition. In some embodiments, this selection comprises selecting a longer alkyl tail (that is, an alkyl tail with a longer chain, whether or not that chain further comprises branches) to correspond to a larger primary electron donor moiety. The method of some embodiments may further or instead comprise selecting a longer alkyl tail to correspond to a less polar solvent, or selecting a shorter alkyl tail to correspond to a more polar solvent. The method of other embodiments may further or instead comprise selecting a longer alkyl tail when the photoactive composition comprises more aromatic (ring) hydrocarbons.

Figure 11:
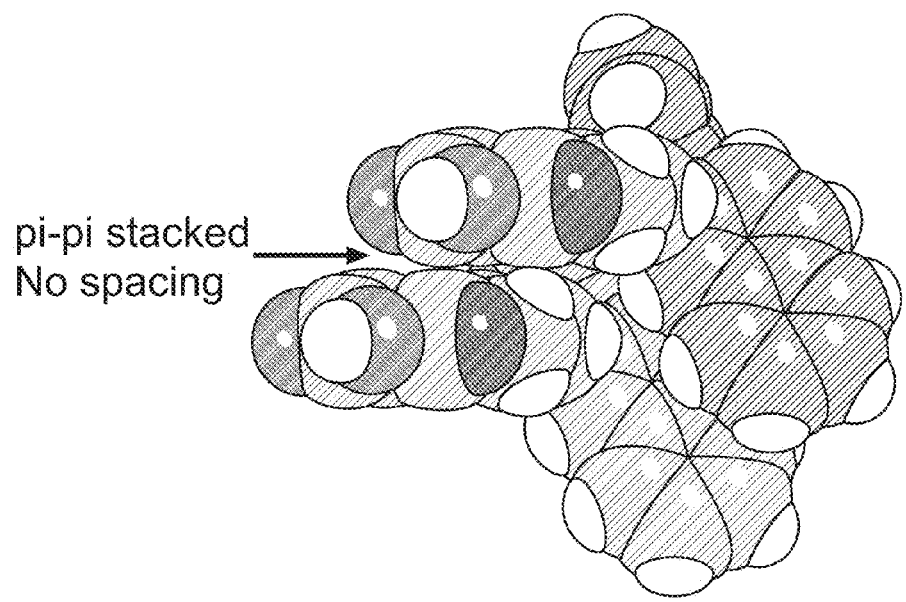
FIG. 11 is an illustration of molecular stacking that results from the presence of aromatic hydrocarbons according to some embodiments of the present disclosure.
Figure 12:
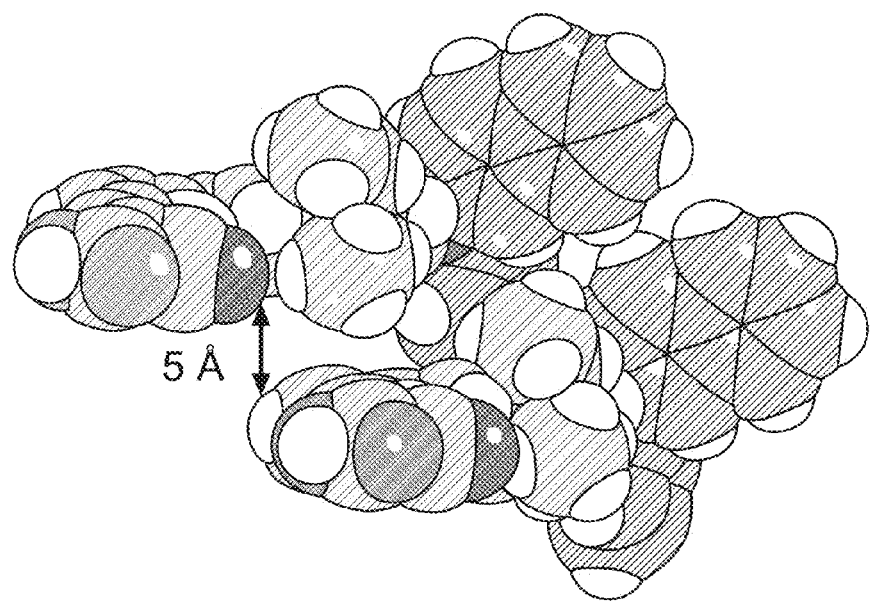
FIG. 12 is an illustration of intermolecular spacing achieved through the addition of one or more alkyl tails to molecules comprising aromatic hydrocarbons, according to some embodiments of the present disclosure.
Figure 13:
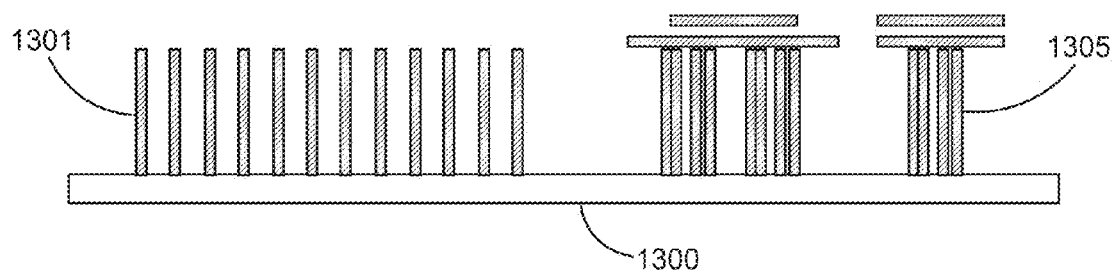
FIG. 13 is a depiction of the alignment of dye molecules on $TiO_2$ surface.

FIG. 11 illustrates examples of molecular stacking resulting from the presence of aromatic (ring) hydrocarbons in the photoactive composition. FIG. 11 is a molecular model of multiple molecules of a derivative of the composition T2 (of FIG. 7), but without the alkyl tails 705. FIG. 12 illustrates examples of employing alkyl tails to provide intermolecular spacing among molecules of the photoactive composition (FIG. 12 is a molecular model of multiple molecules of the composition T2 of FIG. 7 with diethyl alkyl tails 705 appended to the 9,9' carbon of the fluorene 701 of T2). This intermolecular spacing may be necessary to prevent undesirable pi-pi stacking, the bonding interaction between two or more sets of pi-orbitals, which, may lead to detrimental clustering of multiple molecules of the photoactive composition, as depicted in FIG. 13. FIG. 13 shows a stylized example of employment of photoactive compositions as a dye on a DSSC. It depicts correctly aligned dye molecules 1301 on a surface 1300 (e.g., $TiO_2$), as well as 1305 clustered dye molecules on the surface 1300. The alkyl tails of some embodiments of the present disclosure prevent the undesirable clustering 1305, instead leading the dye molecules to maintain intermolecular spacing as with the correctly aligned dye molecules 1301. In other embodiments for applications such as BHJ, OPV, and FET, pi-pi stacking is desirable to induce molecular ordering. In such a case, alkyl tails are used to control the extent and direction of said pi-pi stacking. In some embodiments, the alkyl tail or tails provide advantageous intermolecular spacing when the composition is employed as a dye on a DSSC, BHJ, or hybrid OPV, as represented in FIG. 13 by the correctly aligned dye molecules 1301, as compared to the clustered dye molecules 1305.

In embodiments in which the photoactive composition comprises more than one alkyl tail, the alkyl tails may, in some embodiments, be identical. In other embodiments, they may be different. And in some embodiments, the alkyl tails may be appended to the same carbon atom of the photoactive composition, while in other embodiments, the alkyl tails may be appended to different carbon atoms of the photoactive composition.

Where the alkyl tails are different and bonded to the same carbon atom, however, chirality of the overall composition may result. Having isomers of different chirality intermixed may, in some cases, require alternating molecules of different chirality to achieve optimum intermolecular spacing. Thus, in some embodiments, the photoactive composition may comprise two or more different alkyl tails appended to the same carbon such that it is chiral. Relatedly, some embodiments of the present disclosure may provide a method comprising isolating molecules of only one chirality (and a photoactive composition so isolated and thereby containing only molecules of one chirality). Other embodiments may comprise molecules of mixed chirality, and other embodiments may comprise a method of alternating the R- and S-isomers so as to achieve optimum intermolecular spacing. Further, yet other embodiments may comprise a method of alternating any one or more of the following: D isomers, L isomers, and diastereomers.

Primary Electron Donor Moiety

In some embodiments, the primary electron donor moiety comprises an electron-donating group such as an amine (e.g., an amino substituent). In some embodiments, the primary electron donor moiety comprises an aryl amine, such as a mono- or diaryl amine. In other words, suitable amino substituents may be of the general formula $R_1R_2N-$, where $R_1$ and $R_2$ may or may not be equivalent chemical structures. For example, in some embodiments, $R_1$ and $R_2$ are both phenyls (e.g., a diphenylamino substituent). In other embodiments, $R_1$ may be a phenyl group and $R_2$ a naphthyl group (e.g., a napthyl-phenylamino, or naphthylanilino, substituent). In yet other embodiments, $R_1$ and $R_2$ may both be a napthyl group (e.g., a dinaphthylamino substituent). Furthermore, although any number of isomers may be used in various embodiments, the amino group of some embodiments may comprise the 2-naphthyl anilino isomer (e.g., an N-(2-naphthyl)anilino substituent). In some embodiments, the primary electron donor moiety may comprise a diphenylamine substituent, and in other embodiments, the primary electron donor moiety may comprise a naphthyl triarylamine. Embodiments in which the primary electron donor moiety comprises either of these two classes of substituents may exhibit improved properties by increasing the level of intramolecular delocalization and due to pi-donation from these aromatic groups.

The primary electron donor moiety of other embodiments may comprise a monoaryl amino substituent, such as a methylphenylamino group (e.g., $R_1$ is a methyl group and $R_2$ is a phenyl group), or a methylnaphthylamino group (e.g., $R_1$ is a methyl group and $R_2$ is a naphthyl group). $R_1$ may, in other embodiments, by ethyl, propyl, or any other moiety. It will additionally be appreciated by one of ordinary skill in the art that any other aryl amino or amino functional group can be used as the amine in embodiments wherein the electron donor moiety comprises an amine.

In other embodiments, the nitrogen (N) of the above-discussed amino compounds may be substituted by another trivalent element from Group 15 of the Periodic Table of the Elements. For example, in some embodiments, the nitrogen (N) may be substituted by phosphorous (P), arsenic (As), or antimony (Sb). That is, the primary electron donor moiety may comprise a phosphine (e.g., $R_1R_2P-$), an arsine (e.g., $R_1R_2As-$), or a stibine (e.g., $R_1R_2Sb-$). The $R_1$ and $R_2$ of these compounds may be any of the compounds discussed previously with respect to $R_1R_2N$. Thus, for example, the primary electron donor moiety may comprise a monoaryl phosphine, or a diaryl phosphine (such as a napthyl-phenyl-phosphino) substituent.

In other embodiments the primary electron donor moiety may comprise a divalent substituent, such as an ether (of the general formula R—O—), a sulfide (of the general formula R—S—), or a selenide (of the general formula R—Se—). Again, the R of these formulae may be any of the $R_1$ or $R_2$ compounds discussed previously with respect to $R_1R_2N$.

In other embodiments, the primary electron donor moiety may comprise a substituent selected from any one or more of the following categories: alkyl, phenyl, phenol, alkoxy phenyl, dialkoxy phenyl, alkyl phenyl, and multicyclic aromatic substituents (e.g., naphthylene, anthracene).

Furthermore, in some embodiments, the primary electron donor moiety, regardless of its makeup, is at the opposing end of the composition from the electron-withdrawing moiety.

Figure 17:
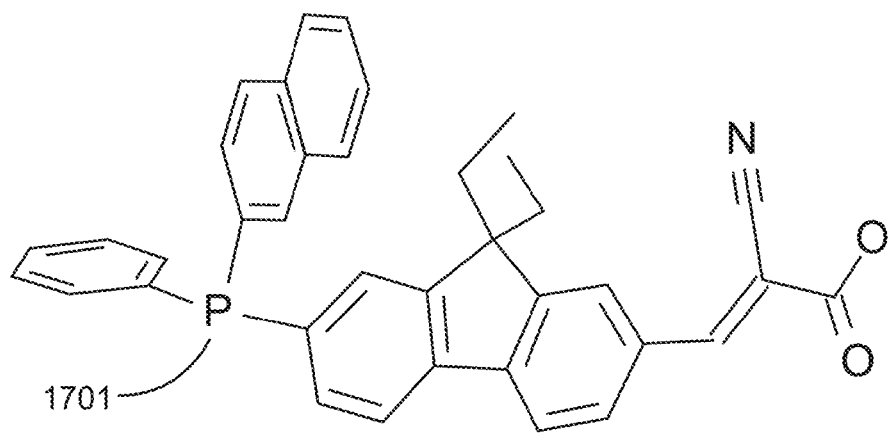
FIG. 17 is a chemical structure for (E)-2-cyano-3-[9,9-diethyl-7-[2-naphthyl(phenyl)phosphanyl]fluoren-2-yl]prop-2-enoic acid according to some embodiments of the present disclosure.
Figure 18:
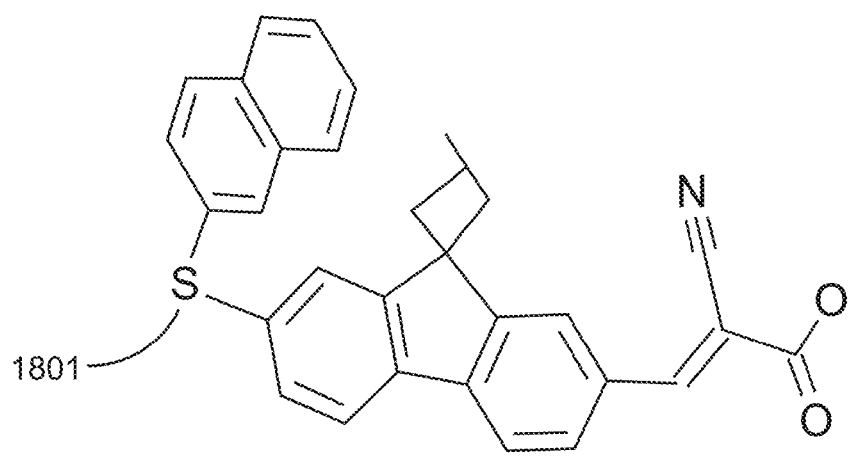
FIG. 18 is a chemical structure for (E)-2-cyano-3-[9,9-diethyl-7-(2-naphthylsulfanyl)fluoren-2-yl]prop-2-enoic acid according to some embodiments of the present disclosure.

Selection of the primary electron donor moiety, with all other components of the composition being otherwise identical, may in some embodiments result in different properties. For example, Table 1 illustrates different HOMO, LUMO, $E_g$, and dipole moment values that result when the primary electron donor moiety comprises: an amine substituent; a phosphine substituent; an arsine substituent; an ether substituent; a sulfide substituent; or a selenide substituent. The amine, phosphine, and arsine substituents of Table 1 are of the structure shown in FIG. 17 (wherein N and As are used in place of the P 1701 of FIG. 17 for the amine and arsine, respectively); and the ether, sulfide, and selenide substituents of Table 1 are of the structure shown in FIG. 18 (wherein O and Se are used in place of the S 1801 of FIG. 18 for the ether and selenide, respectively).

TABLE 1

| Primary Electron Donor | Formula | HOMO (eV) | LUMO (eV) | Dipole Moment (debye) |
| --- | --- | --- | --- | --- |
| Amine | $C_{37}H_{30}N_2O_2$ | 5.08 | 2.44 | 5.26 |
| Phosphine | $C_{37}H_{30}NO_2P$ | 5.71 | 2.56 | 2.98 |
| Arsine | $C_{37}H_{30}AsNO_2$ | 5.83 | 2.55 | 3.07 |
| Ether | $C_{31}H_{25}NO_3$ | 5.69 | 2.48 | 3.84 |
| Sulfide | $C_{31}H_{25}NO_2S$ | 5.65 | 2.57 | 3.01 |
| Selenide | $C_{31}H_{25}NO_2Se$ | 5.60 | 2.57 | 2.98 |

Thus, the present disclosure in some embodiments may further provide a method for selecting the primary electron donor moiety based upon one or more properties of the composition (e.g., HOMO, LUMO, and dipole moment) that would result, consistent with (or as part of) the design method discussed previously and exemplified in FIG. 6. In some embodiments, this may comprise selecting a class of electron donor moiety (e.g., amine, phosphine, arsine, ether, sulfide, selenide) based upon the general qualities exhibited by that class of electron donor moiety.

Electron-Withdrawing Moiety

Figure 5:
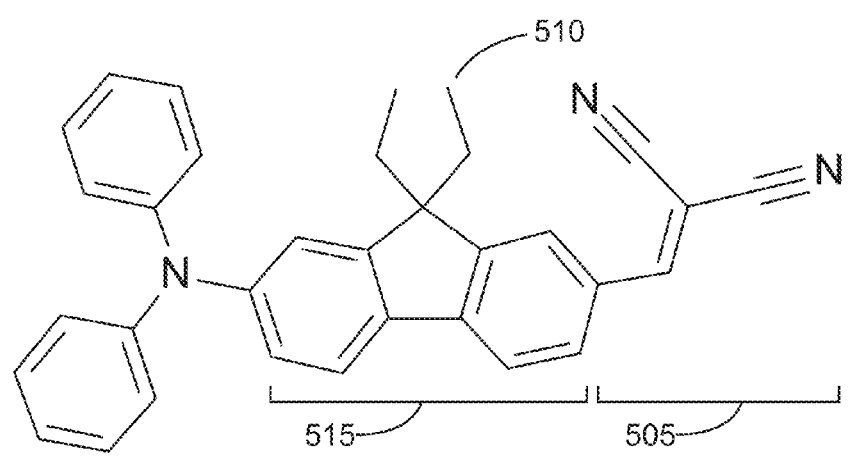
FIG. 5 is a chemical structure for 2-[[9,9'-diethyl-7-(N-phenylanilino)fluoren-2-yl]methylene]propanedinitrile according to some embodiments of the present disclosure

In some embodiments, the electron-withdrawing moiety may be electron-poor. In some embodiments, it may be characterized by a higher electron affinity relative to the electron donor moiety and the core moiety. In other embodiments, the electron-withdrawing moiety may additionally be characterized by desirable electron orbital energy levels (e.g., HOMO/LUMO relative positions that provide advantageous organic semiconducting capabilities, such as a desired band gap $E_g$). Thus, in some embodiments, the electron-withdrawing moiety may comprise a carboxylic acid group in order to exhibit both characteristics (electron affinity and desired HOMO/LUMO relative positions). Examples of suitable carboxylic acid groups of some embodiments include cyanoacrylates. For example, FIG. 4 shows a photoactive composition consistent with the present disclosure in which the electron-withdrawing moiety comprises a cyanoacrylate (i.e., (Z)-2-cyano-3-[9,9'-diethyl-7-(N-phenylanilino)fluoren-3-yl]prop-2-enoic acid). In other embodiments, the electron-withdrawing moiety may comprise any one of the following: a monocyanocomplex, a dicyanocomplex, a thiocyanocomplex, or an isothiocyanocomplex. For example, FIG. 5 shows the photoactive composition 2-[[9,9-diethyl-7-(N-phenylanilino)fluoren-2-yl]methylene]propanedinitrile in which the electron-withdrawing moiety comprises a dicyanocomplex, but is otherwise identical to FIG. 4.

Furthermore, in some embodiments, the electron withdrawing moiety may further comprise a binding moiety; in other embodiments, the electron withdrawing moiety may additionally serve as a binding moiety, without the need to include a separate binding moiety. Thus, for example, in embodiments in which the electron withdrawing moiety comprises a carboxylic acid group, the carboxylic acid group may also function as the binding moiety. In some embodiments, the binding moiety may serve to bind the photoactive composition of matter to another substance such as a substrate (e.g., $TiO_2$), for example in DSSC applications. The binding moiety may also, in some embodiments, serve to bind the photoactive composition to other substances including, but not limited to, Au, Ag, FTO (fluorine-doped tin oxide), ITO (indium tin oxide), or $Nb_2O_5$, as a layer or into supramolecular extended structures, such as metal organic frameworks, covalent organic frameworks, or crystalline structures.

Illustrative Embodiments of Photoactive Compositions and Their Tunability

Figure 7:
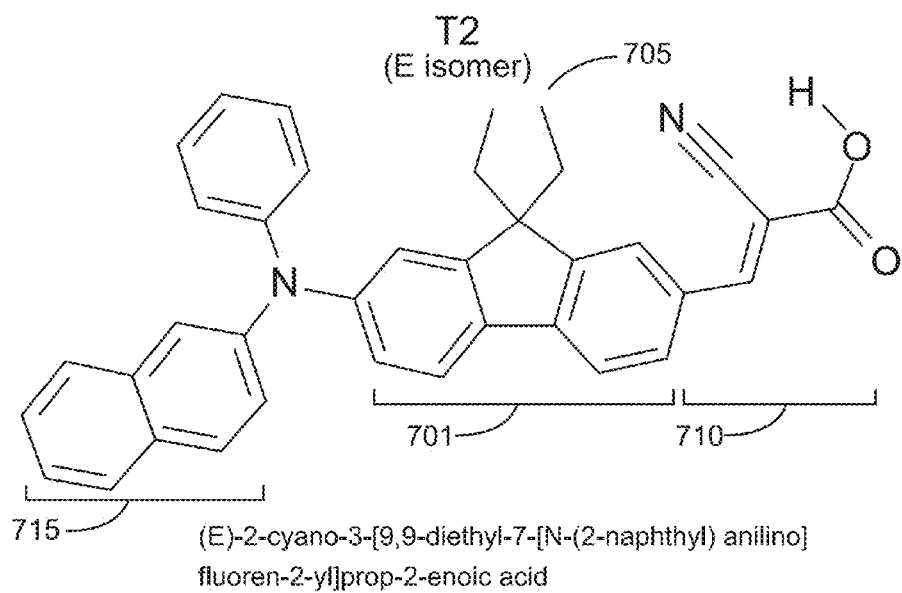
FIG. 7 is a chemical structure for (E)-2-cyano-3-[9,9-diethyl-7-[N-(2-naphthyl)anilino]fluoren-2-yl]prop-2-enoic acid according to some embodiments of the present disclosure.
Figure 8:
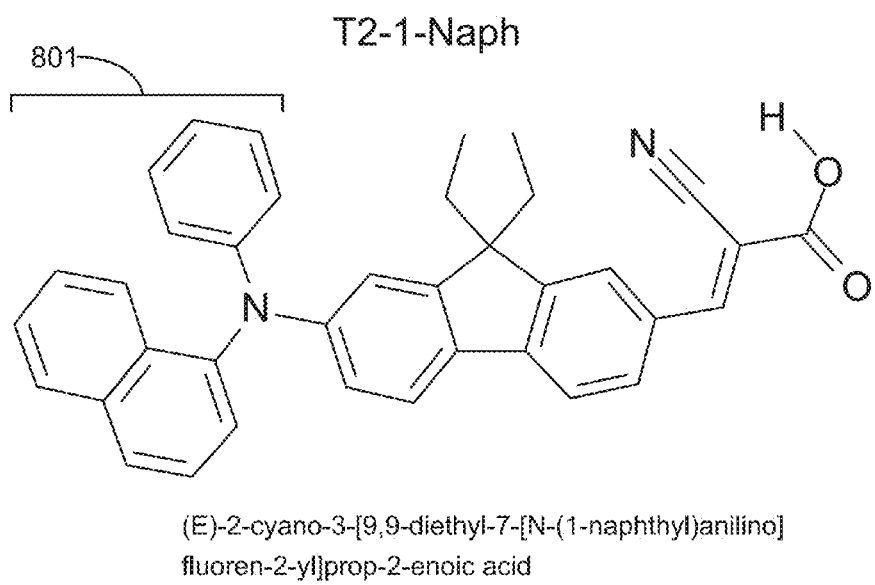
FIG. 8 is a chemical structure for (E)-2-cyano-3-[9,9-diethyl-7-[N-(1-naphthyl)anilino]fluoren-2-yl]prop-2-enoic acid.
Figure 9:
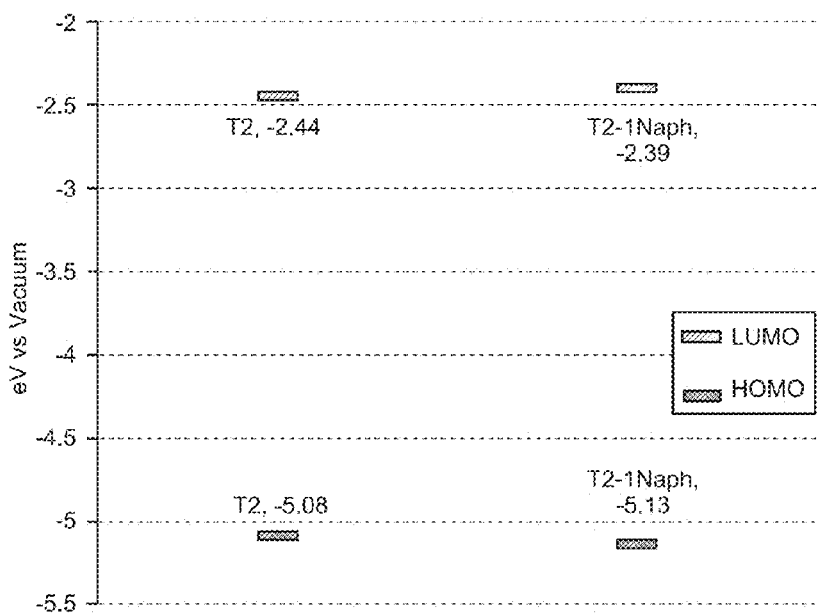
FIG. 9 is a graph containing data derived from computations carried out by molecular modeling software, and which shows the LUMO and HOMO values, in eV, of (E)-2-cyano-3-[9,9-diethyl-7-[N-(2-naphthyl)anilino]fluoren-2-yl]prop-2-enoic acid versus (E)-2-cyano-3-[9,9-diethyl-7-[N-(1-naphthyl)anilino]fluoren-2-yl]prop-2-enoic acid.

Consistent with the above, then, in one embodiment the photoactive compound may comprise 2-cyano-3-[9,9'-diethyl-7-[N-(2-naphthyl)anilino]fluoren-2-yl]prop-2-enoic acid in either the Z or E isomer (with reference to the C=C bond of the propenoic acid). FIG. 7 shows the E isomer, labeled T2, that is, (E)-2-cyano-3-[9,9'-diethyl-7-(N-phenylanilino)fluoren-2-yl]prop-2-enoic acid. In this embodiment, the core moiety 701 comprises fluorene, with two $C_2$ alkyl tails 705 appended to the 9,9' carbon of the fluorene (that is, the core moiety comprises a 9,9' diethyl fluorene). The electron-withdrawing moiety 710 comprises 2-cyano-prop-2-enoic acid, and is bonded at the 3 carbon of the propenoic acid to the core moiety. The primary electron donor moiety 715 here comprises an N-naphthylanilino substituent bonded to the 7 carbon of the fluorene. This embodiment specifically comprises the N-(2-naphthyl)anilino isomer, which exhibits the unexpected benefit of greater photoelectric power conversion efficiency (PCE) (when the compound is used in OPV applications such as a DSSC dye) over a compound that comprises instead the N-(1-naphthyl)anilino isomer 801, but is otherwise identical, as illustrated in FIG. 8 (labeled T2-1-Naph). Specifically, compounds comprising the N-(2-naphthyl)anilino isomer exhibit approximately 6.6% PCE, whereas otherwise identical compounds that instead employ the N-(1-naphthyl)anilino isomer exhibit approximately 6.0% PCE. One possible explanation for this enhanced efficiency is the significant electronic change in the composition that results when the primary electron donor moiety comprises the N-(2-naphthyl)anilino isomer. As shown in FIG. 9, the 2-naphthyl isomer T2 provides the composition with a superior (smaller) band gap ($E_g$) due to the resulting deeper LUMO (−2.44 eV vs vacuum) and shallower HOMO (−5.08 eV vs vacuum). Specifically, the 1-naphthyl $E_g$ is 2.74 eV (again, this is the difference between the LUMO and HOMO), while the 2-naphthyl $E_g$ is 2.64 eV, as shown in FIG. 9, which contains data derived from computations in molecular modeling software. In addition, the 2-naphthyl isomer additionally improves the absorptive properties of the composition, such as by red-shifting (e.g., permitting absorption of longer wave-length light, increasing the spectral window)."

This comparison further illustrates some of the desirable electronic properties previously discussed with respect to tunability considerations, consistent with the design methods of various embodiments of the present disclosure. That is, selection of the 2-naphthyl isomer instead of the 1-naphthyl isomer results in smaller $E_g$, shallower HOMO, deeper LUMO, and therefore smaller $E_g$. This in turn has a positive effect on the PCE and on the absorptive properties of the composition.

Figure 10:
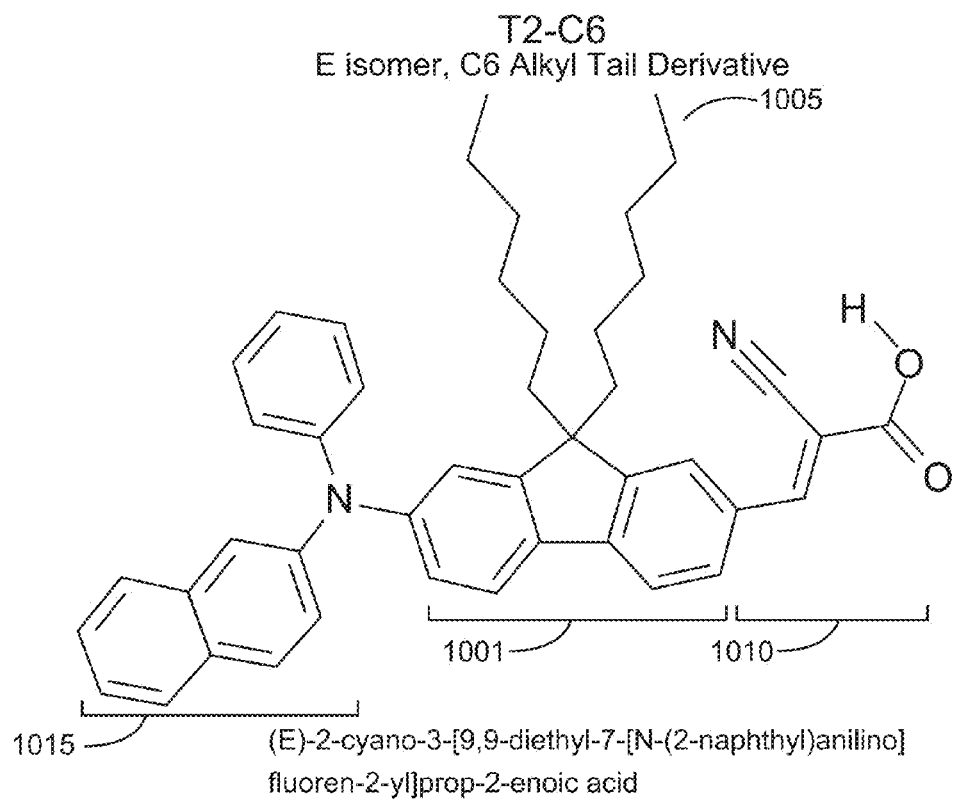
FIG. 10 is a chemical structure for (E)-2-cyano-3-[9,9-dihexyl-7-[N-(2-naphthyl)anilino]fluoren-2-yl]prop-2-enoic acid according to some embodiments of the present disclosure.

Consistent with the above disclosure, other embodiments of compositions of the present disclosure may comprise alkyl tails of differing lengths. For example, embodiments comprising the same electron-donating and electron-withdrawing moieties, but different alkyl tails, include, but are not limited to: 2-cyano-3-[9,9-dipropyl-7[N-(2-naphthyl)anilino]fluoren-2-yl]prop-2-enoic acid; 2-cyano-3-[9,9-dibutyl-7[N-(2-naphthyl)anilino]fluoren-2-yl]prop-2-enoic acid; and so on up to and including $C_{10}$, $C_{15}$, $C_{20}$, $C_{30}$, or $C_{40}$ alkyl tails, consistent with the previous discussion of alkyl tails. The example embodiment (E) 2-cyano-3-[9,9-dihexyl-7-[N-(2-naphthyl)anilino]fluoren-2-yl]prop-2-enoic acid, for example, is labeled T2-C6 in FIG. 10, wherein the core moiety 1001, electron-withdrawing moiety 1010, and primary electron donor moiety 1015 comprise the same substituents as the embodiment T2 depicted in FIG. 7. But, as shown in FIG. 10, the alkyl tails 1005 appended to the 9,9' carbon of the fluorene comprise a dihexyl substituent rather than the diethyl of T2 in FIG. 7. Similarly, FIG. 19 shows the substitution of $C_2$, $C_{10}$, and branched $C_8$ (ethylhexyl) alkyl tails on the 9,9' carbon of fluorene in various embodiments 1901, 1905, and 1910, respectively.

Embodiments using branched alkyl tails (and, again, utilizing the same core, electron-donating, and electron-withdrawing moieties) include, but are not limited to: 2-cyano-3-[9,9-dimethylethyl-7[N-(2-naphthyl)anilino]fluoren-2-yl]prop-2-enoic acid; 2-cyano-3-[9,9-dimethylpropyl-7-[N-(2-naphthyl)anilino]fluoren-2-yl]prop-2-enoic acid; and so on using any branched alkyl tail.

Figure 14:
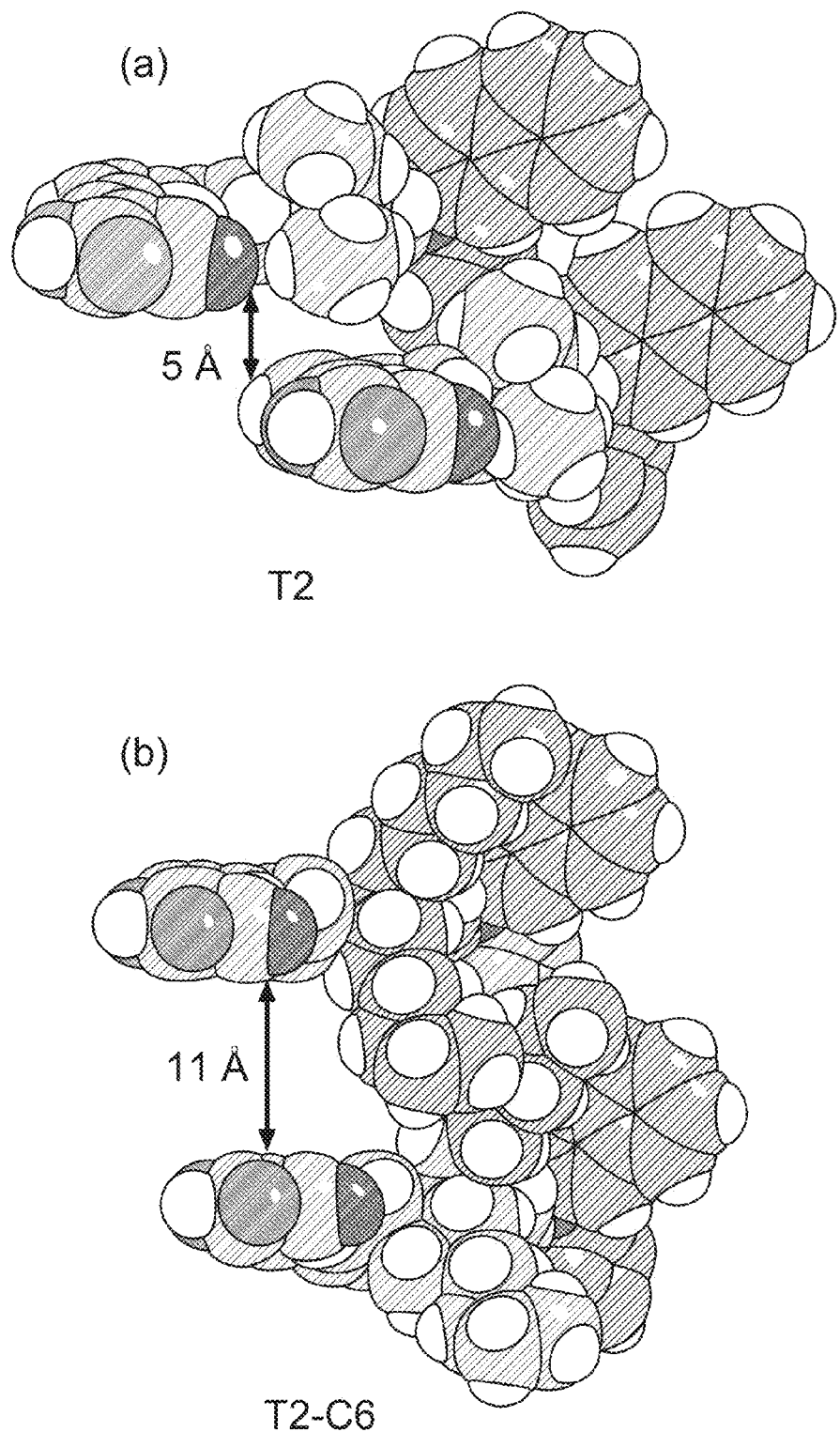
FIG. 14a is a space-filling model of (E)-2-cyano-3-[9,9-diethyl-7-[N-(2-naphthyl)anilino]fluoren-2-yl]prop-2-enoic acid, according to some embodiments of the present disclosure.
FIG. 14b is a space-filling model of (E)-2-cyano-3-[9,9-dihexyl-7-[N-(2-naphthyl)anilino]fluoren-2-yl]prop-2-enoic acid, according to some embodiments of the present disclosure.

As discussed previously, alkyl tails of differing lengths may provide different properties, such as greater intermolecular spacing. Continuing with the example embodiment wherein the composition comprises 2-cyano-3-[9,9-diethyl-7-[N-(2-naphthyl)anilino]fluoren-2-yl]prop-2-enoic acid (that is, T2 of FIG. 7), FIG. 14 illustrates the molecular spacing difference achieved when substituting 9,9' dihexyl alkyl tails 1005 in T2-C6 for the 9,9' diethyl alkyl tails 705 of T2 (11 Å versus 5 Å). This additional spacing could, in some embodiments, prevent aggregation of the molecules of the compound, and thus result in higher device performance when the compound is used in an OPV. This composition difference again further illustrates the additional tunability consideration of intermolecular spacing, which may be taken into account in the design methods of various embodiments previously discussed, particularly at the alkyl tail selection step.

As also discussed previously, in some embodiments alkyl tail selection may depend upon other factors in order to determine the optimum alkyl tail. Table 2 below illustrates $V_{OC}$ (open-circuit voltage), $J_{SC}$ (Photocurrent density), Fill Factor (FF), and power conversion efficiency (PCE) for variations of the embodiment of FIG. 7 (that is, T2), employing different alkyl tails appended to the 9,9' carbon of the fluorene.

TABLE 2

| Alkyl Tail | $V_{OC}$ (mV) | $J_{SC}$ (mA/cm$^2$) | FF (%) | PCE (%) |
|---|---|---|---|---|
| 2 C$_2$ (diethyl) | 780 | 10.7 | 68.5 | 5.70 |
| 2 C$_3$ (dipropyl) | 780 | 12.0 | 65.2 | 6.10 |
| 2 C$_4$ (dibutyl) | 780 | 10.4 | 66.3 | 5.10 |
| 2 C$_5$ (dipentyl) | 753 | 11.3 | 60.0 | 5.10 |
| 2 C$_6$ (dihexyl) | 728 | 10.4 | 66.0 | 5.00 |
| 2 C$_8$ (dioctyl) | 774 | 10.4 | 62.0 | 5.00 |
| 2 C$_{10}$ (didecyl) | 780 | 11.8 | 56.0 | 5.16 |

Figure 15:
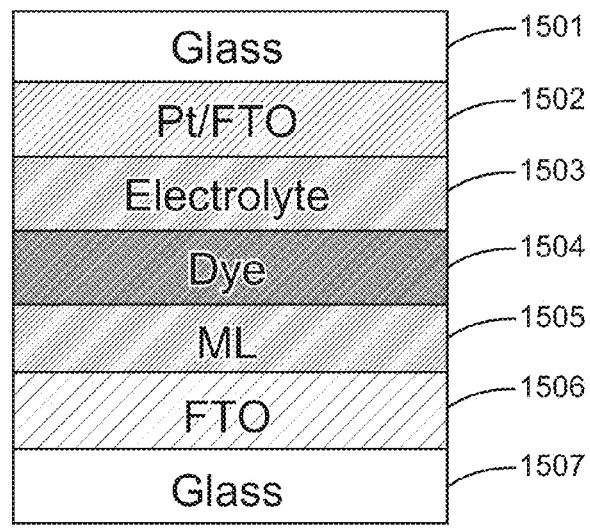
FIG. 15 is an illustration of DSSC design depicting various layers of the DSSC according to some embodiments of the present disclosure.

In Table 2, the composition is used as a dye on an OPV, as illustrated in FIG. 15. FIG. 15 depicts various layers in a typical DSSC: substrate layer 1501 (glass in FIG. 15); electrode layer 1502 (shown as Pt/FTO (F-doped tin oxide)); electrolyte 1503; dye 1504; ML (mesoporous layer, which in some embodiments may be TiO$_2$) 1505; electrode layer 1506 (shown as FTO); and substrate layer 1507 (shown as glass in FIG. 15). In the instances illustrated in Table 2, the composition is employed as a dye 1504 in the absence of a light harvesting layer. A light-harvesting layer may, in some embodiments, be employed to scatter incident light in order to increase its path length through the photoactive layer and therefore the light's probability of being absorbed.

Table 2 further demonstrates the relationship among PCE, $V_{OC}$, $J_{SC}$, and FF, which can be defined according to the following equation:

$$PCE = \frac{V_{OC} \times J_{SC} \times FF}{P_0}$$

where $V_{OC}$, $J_{SC}$, and FF are defined as above with respect to Table 2, and $P_0$ is incident light power density in W/m$^2$.

Figure 16:
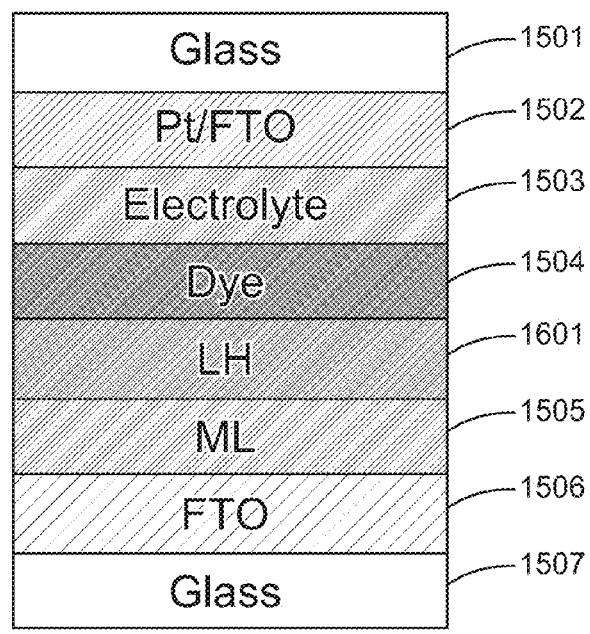
FIG. 16 is another illustration of DSSC design depicting various layers of the DSSC according to some embodiments of the present disclosure.

In contrast, Table 3 presents the same data for the same composition T2 (using varying alkyl tails appended to the 9,9' carbon of the fluorene of T2 as indicated in Table 3) when the composition is employed as a dye 1504 with a Light Harvesting Layer 1601 added between the dye 1504 layer and the ML 1505, as represented in FIG. 16.

TABLE 3

| Alkyl Tail | $V_{OC}$ (mV) | $J_{SC}$ (mA/cm$^2$) | FF (%) | PCE (%) |
|---|---|---|---|---|
| 2 C$_2$ (diethyl) | 730 | 14.6 | 62.0 | 6.60 |
| 2 C$_3$ (dipropyl) | 713 | 14.2 | 61.1 | 6.20 |
| 2 C$_4$ (dibutyl) | 720 | 13.0 | 60.0 | 5.60 |
| 2 C$_5$ (dipentyl) | 758 | 12.5 | 61.0 | 5.80 |
| 2 C$_6$ (dihexyl) | 700 | 12.0 | 66.0 | 5.53 |
| 2 C$_8$ (dioctyl) | 780 | 11.8 | 63.0 | 5.80 |
| 2 C$_{10}$ (didecyl) | 780 | 12.3 | 61.0 | 5.86 |

As can be seen, while C$_3$ alkyl tails provide the greatest PCE in the absence of a light harvesting layer, C$_2$ alkyl tails provide the greatest PCE in the presence of a light harvesting layer. Thus, in some embodiments, the method of alkyl tail selection comprises selecting an alkyl tail based in part upon the presence of a light harvesting layer, which is shown by Tables 2 and 3 to be an additional tunability consideration consistent with the methods of various embodiments previously discussed. In other embodiments, the method of alkyl tail selection comprises selecting an alkyl tail based in part upon any one or more device architectural feature(s), which are also tunability considerations.

It will further be appreciated by one of ordinary skill in the art that other embodiments may comprise different primary electron-donating moieties and/or electron-withdrawing moieties consistent with the previous discussion regarding each of those moieties. For example, FIG. 4 shows another embodiment of a photoactive compound of the present disclosure: (Z)-2-cyano-3-[9,9'-diethyl-7-(N-phenylanilino)fluoren-2-yl]prop-2-enoic acid. In this instance, the core moiety 415, alkyl tails 410, and electron-withdrawing moiety 405 are the same as in T2 of FIG. 7, but the primary electron donor moiety 401 of the embodiment depicted in FIG. 4 comprises an N-phenylanilino substituent instead of the N-(2-naphthyl)anilino substituent of the primary electron donor moiety 715 of T2 in FIG. 7. And FIG. 5 shows an embodiment differing from the embodiment of FIG. 4 only in that the embodiment of FIG. 5 comprises a different electron-withdrawing moiety 505: 2-(methylene) propanedinitrile instead of 2-cyano-prop-2-enoic acid (as in FIG. 4). And in some embodiments, the different primary electron donor moieties and/or electron-withdrawing moieties may be selected based upon the methods of design previously discussed.

Second and Additional Electron Donor Moieties

Referring back to FIG. 2, the photoactive compositions of some embodiments may further comprise a second electron donor moiety 5, which in some embodiments is disposed between the core moiety 1 and the electron-withdrawing moiety 3. The second electron donor moiety may, in some embodiments, serve to further tune the absorption window (i.e., the allowed absorption wavelengths based on the band gap) of the photosensitive compositions of such embodiments. For example, in some embodiments, the second electron donor moiety may result in beneficial reduction of the band gap $E_g$ between the HOMO and LUMO of the photoactive composition. The second electron donor moiety may, in some embodiments, comprise a pi-electron donor. Any pi-electron donor moiety is suitable. FIG. 20, depicts various other embodiments of compositions of the present disclosure, many of which include a second electron-withdrawing moiety. Specifically: T3 comprises a second electron donor moiety 2005 comprising thiophene; T4 comprises a second electron donor moiety 2015 comprising benzothiadiazole; T5 comprises a second electron donor moiety 2025 comprising a phenyl moiety; T6 comprises a second electron donor moiety 2035 comprising benzothiophene; and T7 comprises a second electron donor moiety 2045 comprising thienothiophene. For comparison, T2 of FIG. 20 shows a photosensitive composition with no second electron donor moiety, with the core moiety 2001 (a 9,9'-diethyl fluorene) bonded directly to the electron-withdrawing moiety 2002 (2-cyano prop-2-enoic acid) on the 3-carbon of the acid. T2 of FIG. 20 is also the embodiment T2 illustrated in FIG. 7, that is, (E)-2-cyano-3-[9,9-diethyl-7-[N-(2-naphthyl)anilino]fluoren-2-yl]prop-2-enoic acid. Other examples of suitable second electron donor moieties include, but are not limited to: benzothiazole, benzothiophene, dibenzothiophene, naphthothiophene, dinaphthothiophene, benzonaphthothiophene, 4H-cyclopenta[1,2-b:5,4-b']bisthiophene, and thieno[3,2-b]thiophene.

Referring back to FIG. 20, the compositions T3, T4, T5, T6, and T7 (comprising the second electron donor moieties discussed previously) may exhibit smaller $E_g$ values than exhibited in T2 (also shown in FIG. 7), that is, (E)-2-cyano-3-[9,9-diethyl-7-[N-(2-naphthyl)anilino]fluoren-2-yl]prop-2-enoic acid. As shown in FIG. 21, the $E_g$ of T3 is 2.37 eV; the $E_g$ of T4 is 1.98 eV; and the $E_g$ of T5 is 2.44 eV, while the $E_g$ of T2 is 2.64 eV. And as shown in FIG. 22, the $E_g$ of T6 is 2.22 eV, and the $E_g$ of T7 is 2.28 eV. The data shown in FIGS. 21 and 22 were derived from computations in molecular modeling software.

Accordingly, in some embodiments, the present disclosure further provides for a method of selecting a second electron donor moiety based upon the resulting effect on the HOMO and LUMO (and therefore band gap $E_g$) of the composition, consistent with (or in conjunction with) the design methods of various embodiments previously discussed. That is, in some embodiments, the second electron donor moiety selection step 607 may comprise selection of a second electron donor moiety based at least in part upon the resulting effect on the HOMO and LUMO (and therefore band gap $E_g$) of the composition, as demonstrated for example in FIGS. 21 and 22.

The compounds of some embodiments may comprise more than two electron donor moieties. Third (and greater) electron donor moieties may be selected for addition to the compound according to any of the tunability characteristics discussed herein. For example, a third (or greater) electron donor moiety may be selected for addition to the compound in order further to reduce $E_g$, and/or to modify either or both of the HOMO and LUMO energy levels. Any moiety suitable as a primary or second electron donor moiety may be used as a third or greater electron donor moiety in these embodiments.

Second and Additional Electron-Withdrawing Moieties

The compounds of some embodiments may comprise a second electron-withdrawing moiety. In some embodiments, the second electron-withdrawing moiety may be any moiety suitable for inclusion as an electron-withdrawing moiety, as discussed previously. In other embodiments, the second electron-withdrawing moiety may comprise a substituent that is electron-poor, but is not suitable for binding the compound to a substrate or other surface. That is, in these embodiments it may be preferable to select the second electron-withdrawing moiety from a different subset of moieties than the subset from which the first electron-withdrawing moiety is selected. Thus, in some embodiments, second electron-withdrawing moieties may comprise any one or more of the following: perfluorophenyls, acridones, triazines, and perylene imides. Some embodiments may also comprise three or more electron-withdrawing moieties; these moieties may be selected from any moiety suitable for use as a second electron-withdrawing moiety.

Synthesis

In other embodiments, the present disclosure provides for methods of synthesizing photosensitive compositions.

The process of one example embodiment is described as follows, and with reference to FIG. 23. Each step referred to herein may be accomplished by any of various reaction mechanisms known in the art. Initially, fluorene is obtained by boiling asphaltene samples in ethanol to yield a pale yellow solution. The solution is cooled and then filtered followed by concentration in boiling ethanol. The hot solution is allowed to slowly cool in sand or vermiculite to yield colorless crystals. The obtained fluorene can be further purified, for example, by column chromatography. The foregoing procedure is outlined in FIG. 23 as "Isolation" 2300. The fluorene is first converted into the 4,4'-dibromo derivative, labeled "Bromination" 2310. Next, appropriate alkyl tails are added at the 9,9' position of fluorene by formation of the fluorene anion followed by addition of the selected alkylbromide, which include $\geq C_1$ linear chains such as ethyl, n-propyl or n-decyl, or branched chains like ethylhexyl, in "Alkylation" 2320. Following is the formation of the fluorene-arylamine in the 4-position of the fluorene by a Buchwald-Hartwig coupling with such primary electron donor moieties as diphenylamine, naphthyl-phenylamine, or methylphenylamine, in "Aryl Coupling" 2330. The aldehyde is next formed in the 4' position of the fluorene by lithiation in N-formylpiperidine followed by acid quenching, as depicted by "Formulation" 2340. In addition, an electron withdrawing moiety is added. Following the example set forth in FIG. 23, in "EW group addition" 2350, the cyanoacrylate complex is synthesized by reacting the previously formed aldehyde with cyanoacetic acid in refluxing acetic acid with ammonium acetate promoter.

In some embodiments, "EW group addition" 2350 will determine or depend upon the intended or actual application of the photoactive compound. Thus, in some embodiments, synthesis of a dicyanocomplex instead of the cyanoacrylate complex previously referenced would be suitable for small molecule devices (e.g., OPVs, FETs, OLEDs), when R is CN in FIG. 23. The cyanoacrylate complex formed in other embodiments, on the other hand, would be useful in DSSCs.

Applications

In other embodiments, the present disclosure provides for methods of determining applications for the photosensitive compounds, and for employing the compounds in a selected application. Thus, in some embodiments, the present disclosure provides method of application of photosensitive compounds to PVs. In some embodiments, once design and synthesis of a photosensitive compound is completed, it may be tested to determine the appropriate device structure for its application, as set forth previously and as shown in FIG. 6. Appropriate device structures may be, e.g., DSSC or BHJ, as shown in FIGS. 24a and 24b. FIG. 24a is an illustration of a typical DSSC (shown with a light-harvesting layer), as depicted in FIG. 16. FIG. 24b is an illustration of typical BHJ device design, and includes: glass substrate 2401; ITO (tin-doped indium oxide) strip 2402; interfacial layer 2403; photoactive layer 2404; and LiF/Al cathodes 2405. The materials of BHJ construction referred to are mere examples; any other BHJ construction known in the art may be used consistent with the present disclosure. In some embodiments, the compositions of the present disclosure may be employed in the photoactive layer 2404 of the BHJ, or in the dye layer 1504 of a DSSC.

Typical performance parameters of some embodiments can be seen in Table 4 with PCE≈6.5% when T2 is employed as the DSSC dye 1504, and PCE z 1.4% when it is instead employed as the electron donor in the photoactive layer 2404 of the BHJ. In some embodiments, such test data may at least partially form the basis for determining the application in which a photoactive composition will be employed. Taking the example of T2, in such embodiments it may be determined that T2 should be employed as a DSSC rather than a BHJ. In other embodiments, this test data may suggest further modification of T2 according to the design methods of the present disclosure, keeping in mind the relevant tunability considerations shown in Table 4 and discussed throughout this disclosure.

TABLE 4

| Device | $V_{OC}$ (mV) | $J_{SC}$ (mA/cm$^2$) | FF (%) | PCE (%) |
|---|---|---|---|---|
| BHJ | 780 | 3.77 | 44.0 | 1.37 |
| DSSC | 734 | 10.7 | 65.5 | 6.48 |

The present disclosure in some embodiments likewise provides PVs comprising a photoactive compound of the present disclosure. In some embodiments, the PV may be an OPV. In some embodiments, the OPV may be a DSSC, wherein the dye comprises a photoactive compound of the present disclosure. In some embodiments, the OPV may be a BHJ, wherein the photoactive layer of the BHJ comprises a photoactive compound of the present disclosure. Any DSSC, BHJ, or OPV generally as known in the art may advantageously incorporate the compound of the present disclosure, which may provide substantial benefits over conventional OPVs, particularly greater PCE to cost ratios.

Some embodiments of the present disclosure may be described by reference to the dye-sensitized solar cell depicted as stylized in FIG. 15, wherein the dye 1504 comprises a photoactive compound of the present disclosure. The cell may otherwise be comprised of any DSSC structure known in the art, and otherwise function as known in the art. Thus, an example DSSC as shown in FIG. 15 may be constructed according to the following: electrode layer 1506 (shown as fluorine-doped tin oxide, FTO) is deposited on a substrate layer 1507 (shown as glass). Mesoporous layer ML 1505 (which may in some embodiments be TiO$_2$) is deposited onto the electrode layer 1506, then the photoelectrode (so far comprising substrate layer 1507, electrode layer 1506, and mesoporous layer 1505) is soaked in a solvent (not shown) and dye 1504 comprising a photoactive compound of the present disclosure. This leaves the dye 1504 bound to the surface of the ML. A separate counter-electrode is made comprising substrate layer 1501 (also shown as glass) and electrode layer 1502 (shown as Pt/FTO). The photoelectrode and counter-electrode are combined, sandwiching the various layers 1502-1506 between the two substrate layers 1501 and 1507 as shown in FIG. 15, and allowing electrode layers 1502 and 1506 to be utilized as a cathode and anode, respectively. A layer of electrolyte 1503 is deposited either directly onto the completed photoelectrode after dye layer 1504 or through an opening in the device, typically a hole pre-drilled by sand-blasting in the counter-electrode substrate 1501. The cell may also be attached to leads and a discharge unit, such as a battery (not shown), as is known in the art. Substrate layer 1507 and electrode layer 1506, and/or substrate layer 1501 and electrode layer 1502 should be of sufficient transparency to permit solar radiation to pass through to the photoactive dye 1504. In some embodiments, the counter-electrode and/or photoelectrode may be rigid, while in others either or both may be flexible. The substrate layers of various embodiments may comprise any one or more of: glass, polyethylene, PET, Kapton, quartz, aluminum foil, gold foil, and steel.

Other example embodiments may comprise a PV that comprises a photoactive layer comprising a photoactive compound of the present disclosure. Such embodiments may be described by reference to FIG. 26, which shows a typical PV cell 2610 including a transparent layer 2612 of glass (or material similarly transparent to solar radiation) which allows solar radiation 2614 to transmit through the layer. The transparent layer of some embodiments may comprise any one or more of a variety of rigid or flexible materials such as: glass, polyethylene, PET, Kapton, quartz, aluminum foil, gold foil, or steel. The active layer 2616 is composed of electron donor or p-type material 2618 and electron acceptor or n-type material 2620. Compositions of the present disclosure may be used as either the p- or n-type material or both p- and n-type materials in a single device embodiment. The photo-active layer 2616 is sandwiched between two electrically conductive electrode layers 2622 and 2624, as is known in the art. In FIG. 26, the electrode layer 2622 is an ITO material. The electrode layer 2624 is an aluminum material. Other materials may be used as is known in the art. The cell 2610 also includes an interfacial layer 2626, shown as a PEDOT:PSS material. The interfacial layer may assist in charge separation. In some embodiments, the interfacial layer may comprise a compound of the present disclosure instead of or in addition to the photoactive layer comprising a compound of the present disclosure. There is also an interfacial layer (IFL) 2627 on the aluminum-cathode side of the device. In some embodiments, the IFL 2627 on the aluminum-cathode side of the device may comprise a compound of the present disclosure instead of or in addition to either or both of the photoactive layer and the interfacial layer 2626 comprising a compound of the present disclosure. A typical architecture is substrate-anode-IFL-photoactive layer-IFL-cathode, wherein the photoactive layer comprises a compound of the present disclosure. Other layers and materials may be utilized in the cell as is known in the art. The cell 2610 is attached to leads 2630 and a discharge unit 2632, such as a battery, as is known in the art.

In other embodiments, the present disclosure provides hybrid organic-inorganic PVs comprising photoactive compounds of the present disclosure. FIG. 27 shows an exploded representational view of a sample PV cell having a transparent conducting electrode 2780, an electron blocking layer 2782, a p-type thin film active layer 2684, an n-type organic active layer 2786, a hole blocking layer 2788 and a low work function layer as an electrode 2790. As shown, the n-type organic layer comprises a photoactive compound of the present disclosure while the p-type layer is inorganic. In other embodiments, the p-type layer comprises a photoactive compound of the present disclosure while the n-type layer is inorganic.

In other embodiments, the present disclosure provides solid state DSSCs comprising photoactive compounds of the present disclosure. Some embodiments of these solid state DSSCs may be described by reference to FIG. 28, which is a schematic of a typical solid state DSSC cell. As with the example solar cell depicted in, e.g., FIG. 26, an active layer comprised of p- and n-type active material (2810 and 2815, respectively) is sandwiched between electrodes 2805 and 2820 (shown in FIG. 28 as Pt/FTO and FTO, respectively).

In the embodiment shown in FIG. 26, the p-type active material comprises a solid electrolyte (otherwise known as a hole-transport material); the n-type active material comprises TiO$_2$ coated with a dye; and the dye comprises a photoactive compound of the present disclosure. Substrate layers 2801 and 2825 (both shown in FIG. 28 as glass) form the respective external top and bottom layers of the exemplar cell of FIG. 28. These layers may comprise any material of sufficient transparency to permit solar radiation to pass through to the photoactive layer comprising p- and n-type active material 2810 and 2815, such as glass, polyethylene, PET, Kapton, quartz, aluminum foil, gold foil, and/or steel. Furthermore, in the embodiment shown in FIG. 28, electrode 2805 (shown as Pt/FTO) is the cathode, and electrode 2815 is the anode. As with the exemplar solar cell depicted in FIG. 26, solar radiation passes through substrate layer 2825 and electrode 2815 into the active layer, whereupon at least a portion of the solar radiation is absorbed so as to produces one or more excitons to enable electrical generation according to mechanisms known in the art. The p-type active material 2810 may in some embodiments comprise a solid electrolyte. In some embodiments, it may be CsSnI$_3$, or poly(3-hexylthiophene), spiro-OMeTAD, or any solid p-type material. The solid state DSSCs of some embodiments may comprise a solid state layer in the absence of a liquid electrolyte. Further, the solid state layer (such as CsSnI$_3$) of some embodiments may be internally located in the DSSC (that is, located between the electrodes of the DSSC, as shown in FIG. 28). The p-type and n-type active materials of other embodiments are reversed. That is, in some embodiments, any suitable p-type material may instead be used as n-type material, and vice versa. A solid state DSSC according to some embodiments may be constructed in a substantially similar manner to that described above with respect to the DSSC depicted as stylized in FIG. 15. In the embodiment shown in FIG. 28, p-type active material 2810 corresponds to electrolyte 1503 of FIG. 15; n-type active material 2815 corresponds to both dye 1504 and ML 1505 of FIG. 15; electrodes 2805 and 2820 respectively correspond to electrode layers 1502 and 1506 of FIG. 15; and substrate layers 2801 and 2825 respectively correspond to substrate layers 1501 and 1507.

Employing a photoactive composition of the present disclosure in a solid state DSSC may, in some embodiments, significantly expand the freedom to design the photoactive composition. For instance, in some embodiments, a solid-state layer may advantageously permit a photoactive composition to obtain a shallower HOMO energy level while still maintaining electrical conductivity between the solid-state layer and the photoactive composition. FIG. 29 is a representation of relative energy levels in eV of various components of an exemplar solid state DSSC system that uses a solid-state layer (comprising in this example CsSnI$_3$). The data shown in FIG. 29 was derived from empirical results such as cyclic voltammetry or ultraviolet photoelectron spectroscopy. Comparison between FIG. 29 and FIG. 25 shows that the exemplar solid state DSSC of FIG. 29 uses the CsSnI$_3$ in place of the iodide electrolyte of FIG. 25. FIG. 29 shows the shallower HOMO energy level permitted by use of CsSnI$_3$ (4.92 eV as compared to the 5.34 eV value of iodide electrolyte reduction I$_2^-$→I$_3^-$). That is, the photoactive compound T2 of FIG. 29 could be altered (for example, by the design methods of the present disclosure previously discussed) so as to achieve a shallower HOMO, unlike the photoactive compound T2 of FIG. 25, where the relatively deeper eV value of the iodide electrolyte reduction I$_2^-$→I$_3^-$ provides an upper limit on the HOMO energy level of the photoactive compound T2, as explained previously. Alternatively, in other embodiments, a different photoactive compound consistent with the present disclosure may be used, wherein the different photoactive compound has a shallower HOMO energy level. For example, FIG. 30 shows a different photoactive compound C36 with a much shallower HOMO (4.98 eV) advantageously employed in the DSSC of this embodiment using a CsSnI$_3$ solid-state layer. The data shown in FIG. 30 was derived from empirical results such as cyclic voltammetry or ultraviolet photoelectron spectroscopy. FIG. 31 shows the structure of C36, which is (E)-2-cyano-3-[6-[9,9-diethyl-7-(4-methoxy-N-(4-methoxyphenyl)anilino)fluoren-2-yl]benzothiophen-2-yl]prop-2-enoic acid.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. In particular, every range of values (of the form, "from about a to about b," or, equivalently, "from approximately a to b," or, equivalently, "from approximately a-b") disclosed herein is to be understood as referring to the power set (the set of all subsets) of the respective range of values, and set forth every range encompassed within the broader range of values. Also, the terms in the claims have their plain, ordinary meaning unless otherwise explicitly and clearly defined by the patentee.

What is claimed is:

1. A method comprising:
    synthesizing a photoactive compound comprising (E)-2-cyano-3[5-[9,9-diethyl-7-(4-methoxy-N-(-4-methoxyphenyl)anilino)fluoren-2-yl]thiazol-2-yl]prop-2-enoic acid by:
    halogenating a fluorene moiety so as to form a 4,4'-dihalo fluorene;
    alkylating the fluorene moiety so as to form a photoactive moiety comprising 9,9-diethyl, 4,4'-dihalo fluorene;
    reacting, by a coupling reaction, the photoactive moiety with a first reactant comprising 4-methoxy-N-(-4-methoxyphenyl)aniline so as to form an electron-donor modified photoactive moiety that comprises 9,9-diethyl-2-halo-7(4-methoxy-N-(-4-methoxyphenyl)anilino)fluorene;
    reacting, by a second coupling reaction, the photoactive moiety with a second reactant comprising thiazol so as to form an electron-donor modified photoactive moiety that comprises 9,9-diethyl-7-(4-methoxy-N-(-4-methoxyphenyl)anilino)fluoren-2-yl]thiazol;
    reacting, by a group addition reaction, the electron-donor modified photoactive moiety with a third reactant comprising cyanoacetic acid so as to form (E)-2-cyano-3 [5-[9,9-diethyl-7-(4-methoxy-N-(-4-methoxyphenyl) anilino)fluoren-2-yl]thiazol-2-yl]prop-2-enoic acid.

2. The method of claim 1 further comprising testing the photoactive compound for use in one or more applications selected from the group consisting of: heterojunction photovoltaic cells, hybrid photovoltaic cells, dye-sensitized solar cells, batteries, field-effect transistors, and light-emitting diodes.

3. The method of claim 2 further comprising optimizing the photoactive compound based at least in part upon testing of the photoactive compound, wherein optimizing the photoactive compound comprises any one or more of radiation, thermal treatments, chemical treatments, interfacial modification, and substituting one or more alkyl tails in place of a hydrogen atom of the photoactive compound.

4. The method of claim 3 further comprising synthesizing a modified photoactive compound that comprises the core moiety, the electron-withdrawing moiety, the primary electron donor moiety, the second electron donor moiety, and at least one of the one or more alkyl tails.

5. The method of claim 1 further comprising obtaining the photoactive core moiety from asphaltene.

6. The method of claim 5 wherein obtaining the photoactive core moiety comprises isolating the photoactive core moiety from asphaltene.

7. The method of claim 1 wherein each of selecting primary electron donor moiety and selecting a primary electron donor moiety is carried out on a computer-readable medium.

* * * * *